United States Patent [19]
Takagi

[11] Patent Number: 5,681,393
[45] Date of Patent: Oct. 28, 1997

[54] PLASMA PROCESSING APPARATUS

[75] Inventor: Ken-ichi Takagi, Tachikawa, Japan

[73] Assignee: Anelva Corporation, Tokyo, Japan

[21] Appl. No.: 585,166

[22] Filed: Jan. 11, 1996

[30] Foreign Application Priority Data

Jan. 24, 1995 [JP] Japan ................... 7-027582

[51] Int. Cl.$^6$ ................................. C23C 16/00
[52] U.S. Cl. .................... 118/723 IR; 118/723 I
[58] Field of Search .................. 118/723 IR, 723 I, 118/723 R, 723 AN; 156/345; 216/68; 204/298.37, 298.16

[56] References Cited

U.S. PATENT DOCUMENTS

| | | | |
|---|---|---|---|
| 4,844,775 | 7/1989 | Keeble | 156/643 |
| 4,990,229 | 2/1991 | Campbell et al. | 204/298.06 |
| 5,122,251 | 6/1992 | Campbell et al. | 204/298.06 |
| 5,429,070 | 7/1995 | Campbell et al. | 118/723 R |
| 5,433,812 | 7/1995 | Cuomo et al. | 156/345 |
| 5,476,182 | 12/1995 | Ishizuka et al. | 216/68 |
| 5,525,159 | 6/1996 | Hama et al. | 118/723 I |
| 5,531,834 | 7/1996 | Ishizuka et al. | 118/723 I |
| 5,540,800 | 7/1996 | Qian | 156/345 |
| 5,558,722 | 9/1996 | Okumura et al. | 118/723 I |

FOREIGN PATENT DOCUMENTS

| | | | |
|---|---|---|---|
| 0064124 | 4/1986 | Japan | 118/723 IR |
| 2247375 | 10/1990 | Japan | 118/723 IR |

OTHER PUBLICATIONS

Fumiyoshi Tochikubo et al. *J. Phys. D: Appl. Phys.* 23, "Investigation of the high-frequency glow discharge in Ar at 13:56 MHz byh spatiotemporal optical emission spectroscopy", (1990) pp. 1184–1192.

Hideo Sugai et al., Proc. 15th Dry Process Symposium, *Electrostatic Coupling of Antenna and the Shielding Effect in Inductive RF Plasmas*, (1993) pp. 27–31.

Primary Examiner—John Niebling
Assistant Examiner—Joni Y. Chang
Attorney, Agent, or Firm—Oliff & Berridge

[57] ABSTRACT

An inductive coupling plasma processing apparatus is equipped with a dielectric portion through which high-frequency electric power is introduced and in which a plasma discharge is generated, and the antenna for supplying a discharge chamber with electric power is arranged near the dielectric portion. The dielectric portion is formed on a vacuum chamber having an inside space with low pressure, into which a reactive gas is introduced. The antenna surrounds the dielectric portion and the area of a nearest surface facing the dielectric portion is minimized. The antenna is desired to be so configured that a shape of its cross section perpendicular to a flow direction of a high-frequency current is a flat rectangle, and a long side of the cross section is substantially perpendicular to an outside surface of the dielectric portion. In accordance with the configuration, the area of the antenna's surface facing the dielectric portion can be reduced as much as possible, and an undesirable sputtering action on the antenna projecting part of the dielectric portion can be reduced to the minimum.

23 Claims, 21 Drawing Sheets

Fig.9

PHASE DIFFERENCE MEASUREMENTS
BETWEEN ENDS OF ANTENNA
(UNIT:ANGLE DEGREES)

| ANTENNA WIDTH (mm) <br> HIGH-FREQUENCY ELECTRIC POWER (W) | 2 <br> PRESENT EMBODIMENT | 15 <br> CONVENTIONAL APPARATUS | 150 <br> CONVENTIONAL APPARATUS |
|---|---|---|---|
| 300 | 88.2 | 58.5 | 0.4 |
| 500 | 93.2 | 62.2 | 2.0 |
| 1000 | 94.9 | 64.3 | 7.5 |

PLASMA PROCESSING APPARATUS

BACKGROUND OF THE INVENTION

1. Field of the Invention

The present invention relates to a plasma processing apparatus, and more particularly to a plasma processing apparatus used for a plasma CVD process or a plasma etching process.

2. Description of the Related Art

An example of a conventional induced coupling-type plasma processing apparatus will be explained by referring to FIG. 32. As shown in FIG. 32, high-frequency electric power supplied from a high-frequency electric power introduction unit 113 is introduced into a cylindrical discharge chamber 112 made out of a dielectric material through a loop antenna 111, which is connected to the introduction unit 113. A vacuum chamber in which a plasma process is conducted is formed out of metal. An inside space of the vacuum chamber 114 communicates with an inside space of the discharge chamber 112. In FIG. 32, a front wall of the vacuum chamber 114 is partially cut away in order to show the internal structure thereof. The inside spaces of the discharge chamber 112 and the vacuum chamber 114 are evacuated by a pumping system 115 so as to reduce the internal pressure to a required level. Thereafter, a gas introduction unit 116 provides both the discharge chamber 112 and the vacuum chamber 114 with a reactive gas. An electric discharge occurs in the reactive gas in both the discharge chamber 112 and the vacuum chamber 114 due to high-frequency electric power introduced through the loop antenna 111, and therefore a plasma discharge is generated in the discharge chamber 112 and is distributed into the vacuum chamber 114. Activated species existing in the plasma discharge process a surface of a substrate 118 arranged on a substrate holder 117.

In the conventional plasma processing apparatus, the loop antenna 111 used for introducing the high-frequency electric power has a loop shape which is formed by bending a relatively long and belt-shaped plate into a circular arc, and is so arranged around the discharge chamber 112 so that an inside surface of the loop antenna 111 faces an outside surface of a side wall of the discharge chamber 112. The belt-shaped plate for forming the loop antenna 111 may generally be a conductive plate, such as a metal plate, whose width is about, e.g., 10–20 mm.

An inductive coupling plasma source such as the discharge chamber 112 can easily produce a high-density plasma discharge necessary for high-rate processing in a semiconductor manufacturing process, which is an important condition. Further, the plasma source can easily accommodate the generation of plasma having an increased volume and a uniform distribution. The diameter of substrates to be processed will likely increase in the future, and the plasma source can be easily changed to conform to this enlargement of the substrate. Therefore, various structures and functions of the inductive coupling plasma source are being studied.

In the inductive coupling plasma processing apparatus configured by using an ordinary loop antenna, it has been conventionally considered that an inductive electric field, in the plasma discharge, produced by an oscillating magnetic field provided from the loop antenna arranged around the discharge chamber, holds the generated plasma discharge.

In accordance with recent studies (for example, Y. Hikosaka, N. Nakamura and H. Sugai: Proc. 15th Symp. Dry Process (Tokyo, 1993), pp. 97.), however, it has been reported that sputtering, which is an undesirable phenomenon, occurs on a part of the discharge chamber onto which the antenna projects, or shadows, in inductive coupling plasma processing apparatuses with a loop antenna. This undesirable phenomenon is caused by a capacitive coupling between the loop antenna and the plasma discharge in the discharge chamber, and therefore plasma generation due to this capacitive coupling cannot be ignored in processing substrates in the inductive coupling plasma processing apparatuses. Why such an undesirable phenomenon occurs is supposed as follows.

An electric field generated in close vicinity to the loop antenna produces a negative self-bias region with a relatively large minus quantity in a surface of the discharge chamber made out of the dielectric substance, onto which the antenna projects. Therefore, the negative self-bias region forms ion sheaths for generating a strong electric field in the inside space of the discharge chamber. The ion sheaths cause ions to be accelerated toward the side wall of the discharge chamber, and the accelerated ions sputter the inside surface of the discharge chamber. The above-mentioned phenomenon in the inductive coupling plasma processing apparatus is the same as plasma generation due to capacitive coupling in a main plasma generating and holding mechanism in an ordinary diode parallel-plate plasma processing apparatus. In an actual semiconductor process, the sputtering phenomenon on the inside surface of the discharge chamber results in contamination of the surface of the substrate to be processed. In addition, the sputtering phenomenon causes problems with respect to durability and safety.

Similarly, the above-mentioned problems often occur in a plasma processing apparatus with a spiral antenna including a plurality of loop antenna elements, or a helicon-wave plasma processing apparatus using two loop antennas.

SUMMARY OF THE INVENTION

An object of the present invention is to provide a plasma processing apparatus with a simple structure which protects against an undesirable sputtering action on an internal surface of the discharge chamber and against contamination in a semiconductor process based on plasma, and which improves the durability and the safety of the discharge chamber.

A plasma processing apparatus according to the present invention comprises: a vacuum chamber having a dielectric portion into which high-frequency electric power is introduced and in which a plasma discharge may be generated; an evacuation unit for reducing a pressure in an inside space of the vacuum chamber; a gas introduction unit for introducing a reactive gas into the vacuum chamber; an antenna arranged around the dielectric portion and having a surface nearest to the dielectric portion, the area of the nearest surface being minimized; a high-frequency electric power introduction unit for supplying the antenna with high-frequency electric power and introducing the high-frequency electric power into the vacuum chamber through the dielectric portion in accordance with an inductive coupling action; and, a substrate holding unit arranged in the vacuum chamber, a holding surface of which faces an inside space of the dielectric portion.

The apparatus of the present invention includes the antenna arranged around the dielectric portion, through which the high-frequency electric power is supplied into the dielectric portion. The dielectric portion provided for the vacuum chamber in which a substrate may be processed by the generated plasma is equipped to introduce the high-frequency electric power used for generating the plasma discharge into the vacuum chamber by means of the inductive coupling action. Since the antenna is so formed that the area of the surface thereof nearest to the outside surface of the dielectric portion is minimized, an undesirable sputtering action on the part of the dielectric portion onto which the antenna projects is reduced to a minimum. Accordingly, generation of plasma due to a capacitive coupling action can be reduced as much as possible.

In the configuration of the plasma processing apparatus, preferably, the antenna is so formed that the shape of a cross section thereof is perpendicular to the flow direction of a high-frequency current is flat and the long side of the cross section is substantially perpendicular to the outside surface of the dielectric portion.

In accordance with the configuration, the area of the antenna's surface facing the outside surface of the dielectric portion is reduced as much as possible, and therefore the sputtering action on the part of the dielectric portion onto which the antenna projects is reduced to a minimum. Thus, generation of plasma due to the capacitive coupling action can be reduced to a minimum.

In the plasma processing apparatus, preferably, the dielectric portion forms a part of the vacuum chamber and the antenna is formed in a single loop shape so as to surround the dielectric portion.

In the plasma processing apparatus, preferably, the dielectric portion forms a part of the vacuum chamber and the antenna is formed in a plural turns spiral shape so as to surround the dielectric portion.

In the plasma processing apparatus, preferably, the dielectric portion forms a part of the vacuum chamber and the antenna includes at least two loop antenna elements arranged at an arbitrary interval so that the two loop antenna elements surround the dielectric portion.

In the plasma processing apparatus, preferably, the shape of the dielectric portion is cylindrical.

In the plasma processing apparatus, preferably, the shape of the dielectric portion is hemispheric.

In the plasma processing apparatus, preferably, the antenna has a flat-plate loop shape and is arranged so that the antenna can be substantially perpendicular to the outside surface of the dielectric portion.

In the plasma processing apparatus, preferably, the dielectric portion has a flat-plate shape and the antenna has a loop shape wherein the size thereof in an axial direction is relatively large and the size thereof in a diameter direction is relatively small.

In the plasma processing apparatus, preferably, the dielectric portion has a flat-plate shape and the antenna has a rib shape which has at least one flat-plate portion arranged perpendicular to the outside surface of the dielectric portion.

In the plasma processing apparatus, preferably, the length ratio between the long side and the short side of the cross section of the antenna is three or more.

In the plasma processing apparatus, preferably, an edge of the antenna facing the outside surface of the dielectric portion has an acute angle in the cross section thereof.

In the plasma processing apparatus, preferably, the shape of the cross section of the antenna is oval.

The plasma processing apparatus further comprises preferably a well-known magnetic field generating unit for producing a magnetic field in the inside space of the vacuum chamber where the plasma discharge may be generated.

In the plasma processing apparatus, preferably, the antenna includes a passage in which cooling media flows.

The plasma processing apparatus further comprises preferably a passage member arranged around the antenna for introducing cooling media.

BRIEF DESCRIPTION OF THE DRAWINGS

A preferred form of the present invention is illustrated in the accompanying drawings in which:

FIG. 5(A) and (B) are waveform charts of voltage and current between both ends of the loop antenna (antenna width=2 mm) according to the first embodiment, wherein FIG. 5(A) shows voltage and current waveforms on the side of a high-frequency electric power source.

FIG. 6(A) and (B) are waveform charts of voltage and current between both ends of the loop antenna (antenna width=15 mm) according to the first embodiment, wherein FIG. 6(A) shows voltage and current waveforms on the side of a high-frequency electric power source.

FIG. 7(A) and (B) are waveform charts of voltage and current between both ends of the loop antenna (antenna width=150 mm) according to the first embodiment, wherein FIG. 7(A) shows voltage and current waveforms on the side of a high-frequency electric power source.

FIG. 9 is a table showing a phase difference in the ends of the respective aforementioned loop antennas;

DESCRIPTION OF THE PREFERRED EMBODIMENTS

In accordance with the accompanying drawings, some preferred embodiments of the present invention will be explained hereinafter.

Figure 1:
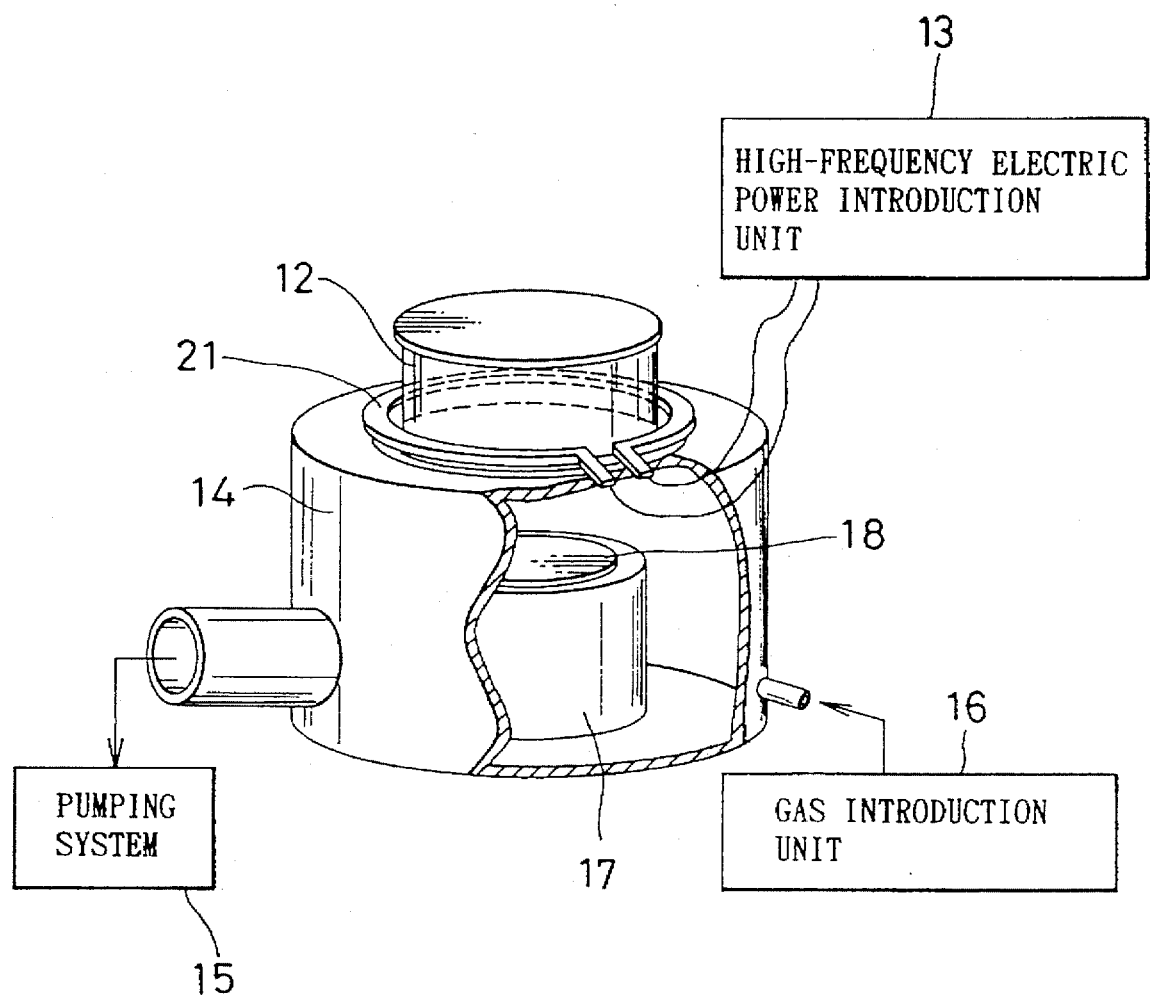
FIG. 1 is a partially cutaway view in perspective of a preferred embodiment of the plasma processing apparatus according to the present invention.

FIG. 1 shows a typical embodiment of the present invention. In a plasma processing apparatus according to this embodiment, a single loop antenna having a flat plate shape is used. A cylindrical discharge chamber 12 having a closed upper end is arranged on a vacuum chamber 14. Respective inside spaces of the vacuum chamber 14 and the discharge chamber 12 are mutually connected. In the discharge chamber 12, at least the cylindrical side wall thereof is made out of a dielectric material such as quartz or the like, and an inside diameter of the cylindrical side wall is 266 mm, for example. Further, the whole of the discharge chamber 12 can be made out of the dielectric substance. The vacuum chamber 14 is formed by a metal member and has a substrate holding unit 17 internally positioned under the discharge chamber 12, on which a substrate 18 to be processed is placed. The vacuum chamber 14 and the discharge chamber 12 are evacuated by a pumping system 15 and therefore the internal pressure of each mutually interconnected chamber 14 and 12 is reduced to a required level. Further, after the pressure is reduced, a gas introduction unit 16 supplies the inside spaces of the chambers 14 and 12 with a necessary reactive gas. A single loop antenna 21 having a shape like a flat plate is so arranged around the cylindrical side wall of the discharge chamber 12 that the single loop antenna 21 surrounds the side wall. The single loop antenna 21 is connected with a high-frequency electric power introduction unit 13 which supplies high-frequency electric power to the single loop antenna 21.

The above-mentioned plasma processing apparatus operates as follows. Firstly, the pumping system 15 including an oil-sealed rotary mechanical pump and an oil diffusion pump or the like operates so that the internal space of the vacuum chamber 14 and the discharge chamber 12 may attain a desired vacuum state having a desired pressure, and afterward the gas introduction unit 16 supplies the vacuum chamber 14 with the reactive gas while the vacuum state is kept at the required low pressure by the evacuating action of the pumping system 15. In addition, the high-frequency electric power introduction unit 13 supplies the discharge chamber 12 through the single loop antenna 21 so that in the discharge chamber 12 a plasma discharge phenomenon can be produced. The reactive gas introduced into the vacuum chamber 14 can be activated by the plasma, and active species in the plasma process the substrate 18 arranged on the substrate holding unit 17.

Figure 2:
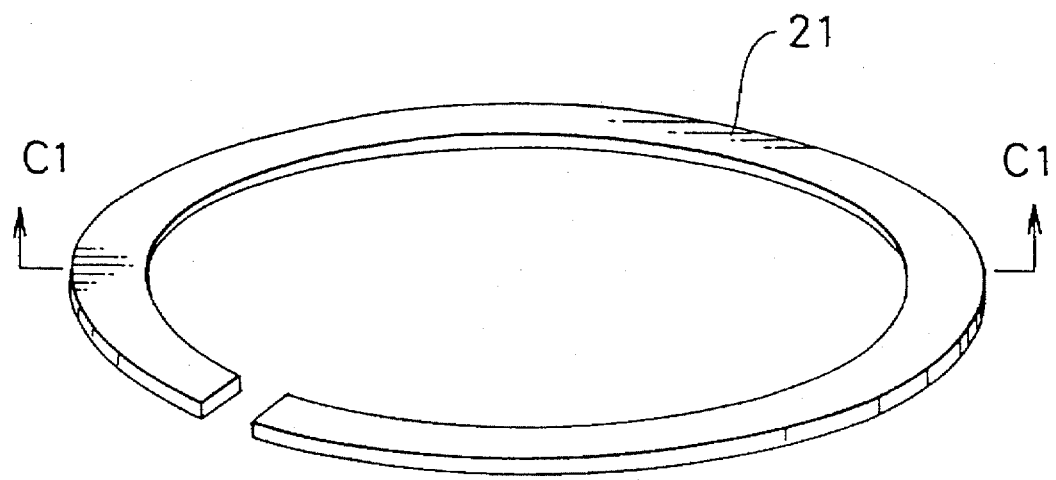
FIG. 2 is a perspective view of a first embodiment of a flat loop antenna used in the embodiment illustrated in FIG. 1.
Figure 3:
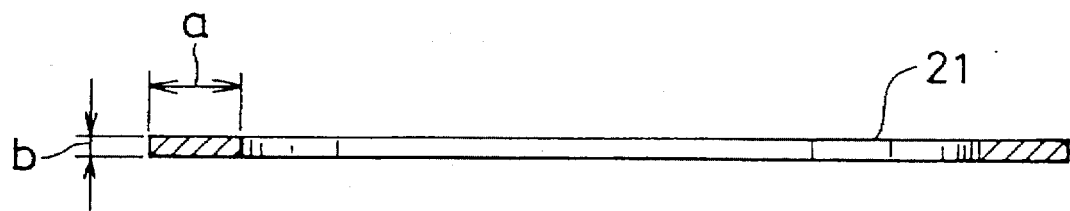
FIG. 3 is a view in section along the line C1—C1 of FIG. 2.

Next, the configuration of the above-mentioned single loop antenna 21 will be explained. FIGS. 2 and 3 illustrate a first embodiment of the single loop antenna 21. FIG. 2 is a perspective view of the single loop antenna and FIG. 3 is a sectional view taken substantially along the line C1—C1 of FIG. 2. The cross sectional view shown in FIG. 3 is a cross section perpendicular to a flow direction of a high-frequency current flowing in the single loop antenna 21. This perpendicularity applies to all of the sectional views similar to FIG. 3, which will be explained hereinafter. Here, in the cross section of the single loop antenna, a size (b) of the side facing the outside surface of the side wall of the discharge chamber 12 is defined as a "antenna width", and a size (a) of the side perpendicular to the outside surface of the side wall is defined as a "thickness". In the single loop antenna 21 actually used in the experimental apparatus, as shown in FIG. 3, the thickness (a) is 15 mm and the antenna width (b) is 2 mm with respect to sizes of the cross sectional shape thereof. The cross sectional shape is a rectangle where the long side is the thickness (a=15 mm) and the short side is the antenna width (b=2 mm), and therefore the loop antenna 21 is formed to have a flat shape as a whole.

Figure 32:
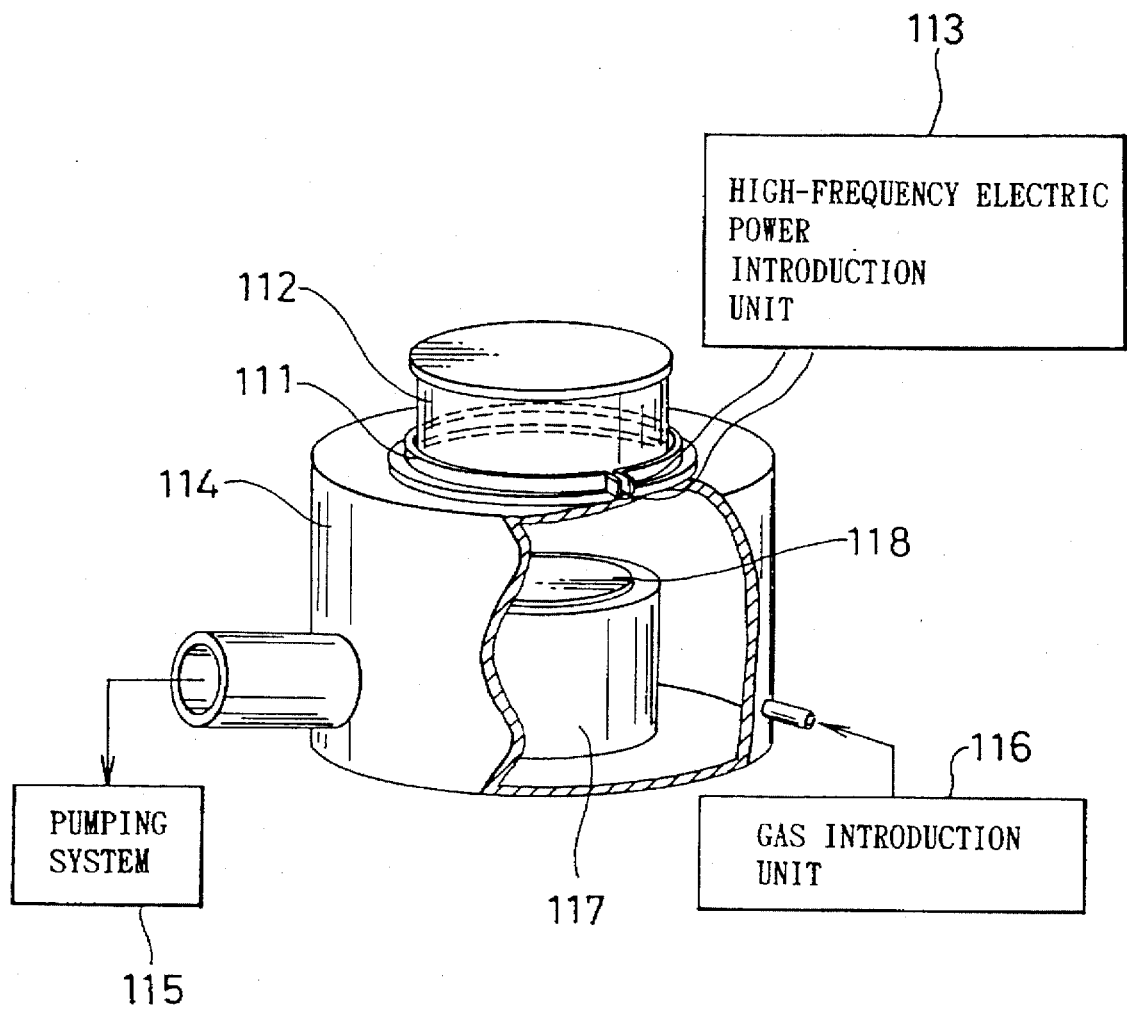
FIG. 32 is a partially cutaway view in perspective of a conventional plasma processing apparatus of the prior art.

High-frequency electric power supplied to the plasma based on a capacitive coupling action between the discharge chamber 12 and the single loop antenna 21 arranged around the side wall of the discharge chamber 12 is proportional to the area of the part of the single loop antenna which projects onto or over the discharge chamber. The area of the part projecting onto the discharge chamber 12 substantially corresponds to the area of the surface of the single loop antenna 21 which faces the side wall of the discharge chamber 12. Accordingly, minimizing the area projecting onto the discharge chamber 12 is considered to be able to reduce the amount of electric power supplied to the plasma by means of the capacitive coupling action. In order to minimize the area projecting onto the discharge chamber 12, the antenna width (b) of the above-mentioned loop antenna 111 shown in FIG. 32 must be minimized. However, when minimizing merely the antenna width (b) of the loop antenna 111, an amount of heat (joules) caused by an antenna surface current is increased and therefore loss of electric power increases, because the resistance of the loop antenna 111 is increased. Further, an allowable current in the loop antenna is decreased. In order to solve this problem, it is desirable that the long side of a flat rectangular cross section of the loop antenna should be substantially perpendicular to the outside surface of the side wall in the discharge chamber 12. Further, when comparing a single loop antenna with another type of antenna such as a spiral antenna or a multiple turns antenna, the single loop antenna which has a minimum number of turns and is symmetrical regarding an axis of the cylindrical discharge chamber 12 is an optimum antenna shape for the plasma processing apparatus of the present invention, because the area projecting onto the discharge chamber, that is, the area of the surface on the antenna facing the outside surface of the side wall in the discharge chamber, can be minimized.

The single loop antenna 21 is formed so as to satisfy the above-mentioned conditions concerning the shape of the cross section. Accordingly, the surface area in the cross section of the single loop antenna 21 where the high-frequency current flows can be identical to the corresponding area of the conventional loop antenna 111, even though in the single loop antenna 21 the antenna width of the portion facing the outside surface of the side wall in the discharge chamber 12 is reduced to about ⅛ that of the antenna width of the corresponding portion in the conventional loop antenna 111, in which the antenna width is 15 mm and the thickness is 1 mm.

The shape of the single loop antenna 21, in which the shape of the cross section thereof is rectangular and the long side of the cross section is substantially perpendicular to the outside surface of the side wall of the discharge chamber 12, makes the area projecting onto the discharge chamber 12 a minimum.

The strength of two effects of the single loop antenna 21 with respect to the internal space of the discharge chamber 12 based on capacitive and inductive coupling respectively depends on the mathematical integration of the area of each surface portion relating each of the two couplings in the whole surface of the single loop antenna 21. Further, when the distance between the discharge chamber 12 and the surface of the loop antenna facing the discharge chamber 12 is defined as (d), the effect based on the capacitive coupling is proportional to $1/d^2$, and the effect based on the inductive coupling is proportional to $1/d$. Therefore, the effect of the capacitive coupling can be relatively reduced in comparison with the effect of the inductive coupling by minimizing the area of the loop antenna which projects onto the discharge chamber 12. Minimizing the area of the loop antenna which projects is achieved by minimizing the antenna width of the loop antenna's surface nearest to the discharge chamber 12 and making the long side of the single loop antenna perpendicular to the outside surface of the side wall in the discharge chamber 12. As a result, the amount of high-frequency current flowing in the surface portion of the single loop antenna 21 is nearly equal to the amount of high-frequency current flowing in the conventional loop antenna 111 having an antenna width of 15 mm and a thickness of 1 mm, and therefore the single loop antenna 21 has such a feature that the electric power supplied into the plasma due to the capacitive coupling can be reduced without changing the electric power supplied into the plasma due to the inductive coupling.

Figure 4:
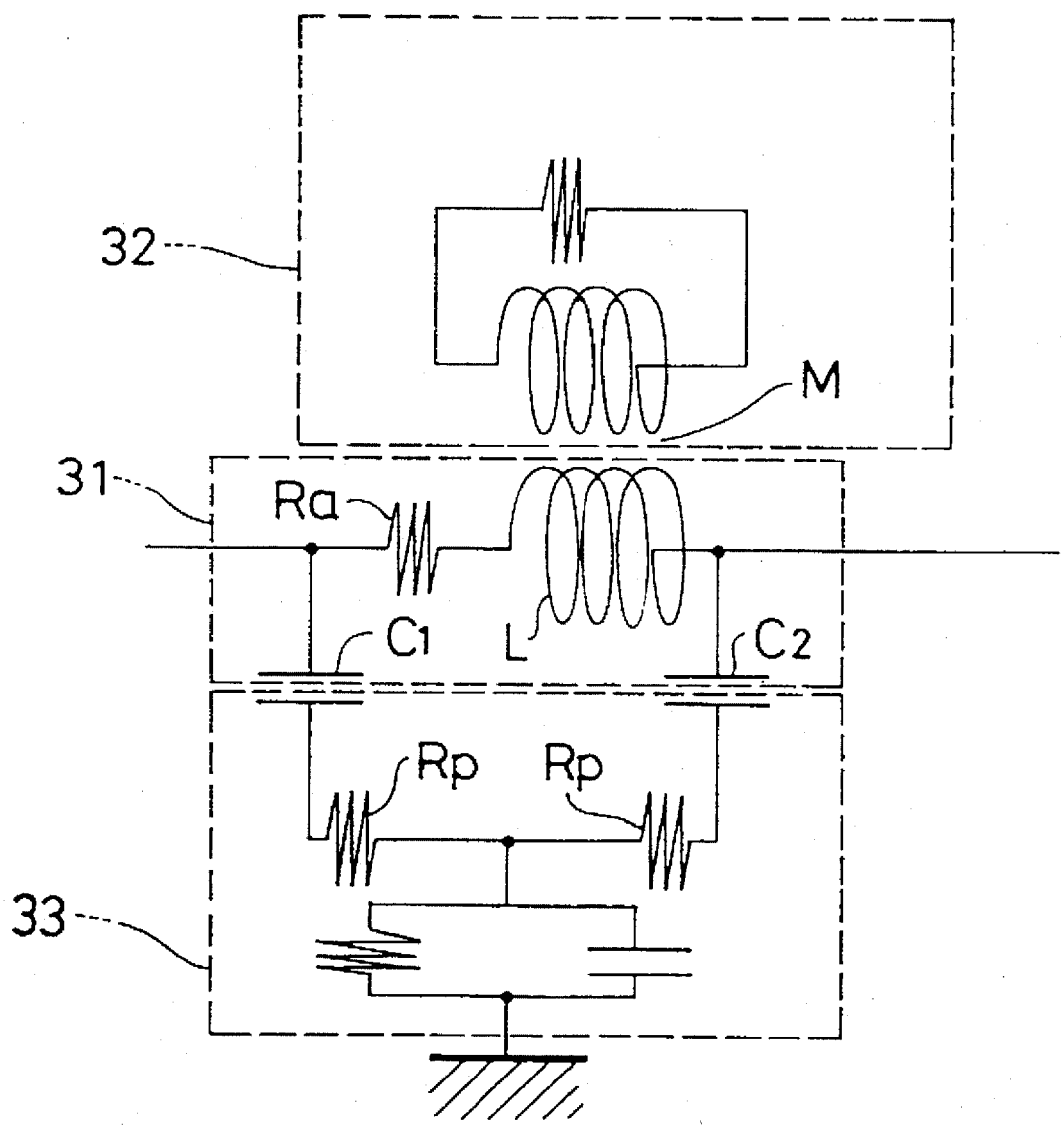
FIG. 4 is an equivalent circuit diagram of an antenna portion including plasma in an inductive coupling plasma source.

Regarding plasma generation based on a typical diode parallel-plate unit having electrodes, measurement of the phase difference of current against voltage between both ends of the diode parallel-plate electrodes holding the plasma has been reported (F. Tochikubo, T. Kokubo, S. Kakuta, A. Suzuki and T. Makabe, J. Phys. D: Appl. Phys. 23 (1990) 1184). According to the report, at a typical industrial frequency of 13.56 MHz, a capacitance has been discussed on the basis of a phase lead of the current to the voltage. The discussion indicates that, when considering the diode parallel-plate unit holding the plasma as one element of the electric elements of an equivalent circuit, the phase lead of the current in an alternating current equivalent circuit enhances the capacitance. In an inductive coupling plasma source, similarly, it is considered that determination as to whether the electric power supply to the plasma is based on an inductive coupling or a capacitive coupling can be performed based on the phase difference between the current and voltage in the both ends of the single loop antenna. An equivalent circuit of the single loop antenna including the plasma is shown in FIG. 4. In this figure, a block element 31 designates an equivalent circuit of the single loop antenna, and block elements 32 and 33 designate equivalent circuits of the plasma. $C_1$ and $C_2$ designate a value of capacitance between the single loop antenna and the plasma, $R_p$ designates a value of resistance of the plasma, $R_a$ designates a value of self-resistance of the single loop antenna, L designates a value of self-inductance of the single loop antenna, and M is a value of mutual inductance between the single loop antenna and the plasma. In the equivalent circuit shown in FIG. 4, however, in order to differentiate a plasma caused by the inductive coupling and a plasma caused by the capacitive coupling, the electric component for the plasma is divided into the element 32 due to the inductive coupling and into element 33 due to the capacitive coupling. An impedance Z between both ends of the single loop antenna is given in accordance with the following formula:

$$Z=\{2R_pR_a\gamma+2R_p\alpha^2+R_a\beta^2\}/\{(\alpha-\beta)^2+\gamma^2\}+j\{4R_p^2\alpha+\alpha\beta^2-\alpha^2\beta-R_a^2\beta\}/\{(\alpha-\beta)^2+\gamma^2\}$$

wherein:

$\alpha=L\omega+M\omega$ $\beta=(C_1+C_2)/C_1C_2\omega$ $\gamma=R_a+2R_p$

When the values ($C_1$ and $C_2$) of the capacitance are decreased, $\beta$ is increased. $\beta$ is a relatively large value in comparison with $\alpha$ and $\gamma$, and therefore reactance of the impedance Z is controlled by $\beta$. The reactance is increased in a positive direction. Thus, when considering the antenna including the plasma as an equivalent electric element, the phase difference approaches a positive 90 degree angle in the case that the inductance is increased, while the phase difference approaches a negative 90 degree angle in the case that the capacitance is increased. Accordingly, the degree of coupling between the single loop antenna and the plasma can be known by judging the capacitance and inductance of the antenna including the plasma on the basis of a measurement of the phase difference between the ends of the single loop antenna.

Figure 5A:
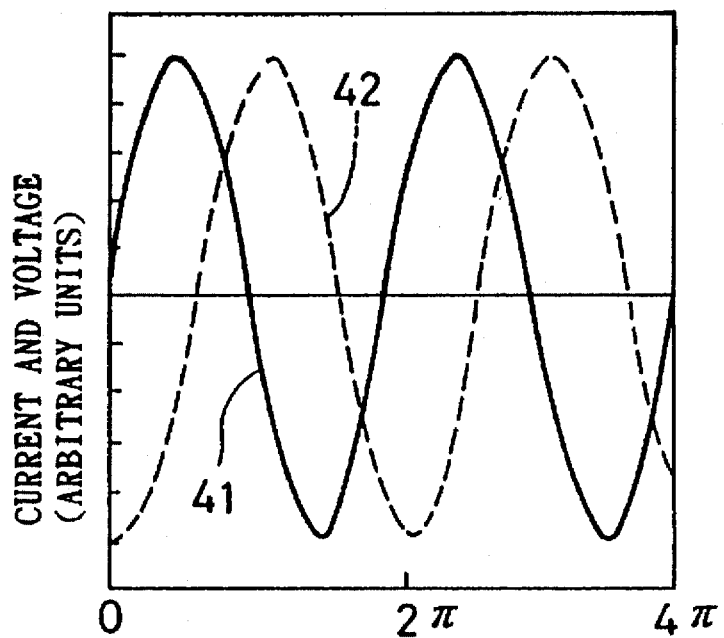
Figure 5B:
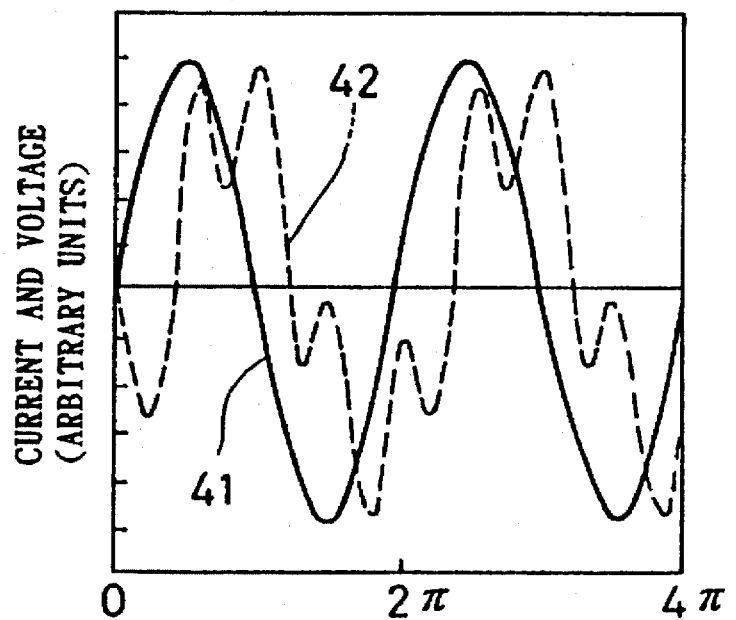
FIG. 5(B) shows voltage and current waveforms on the side of ground.
Figure 6A:
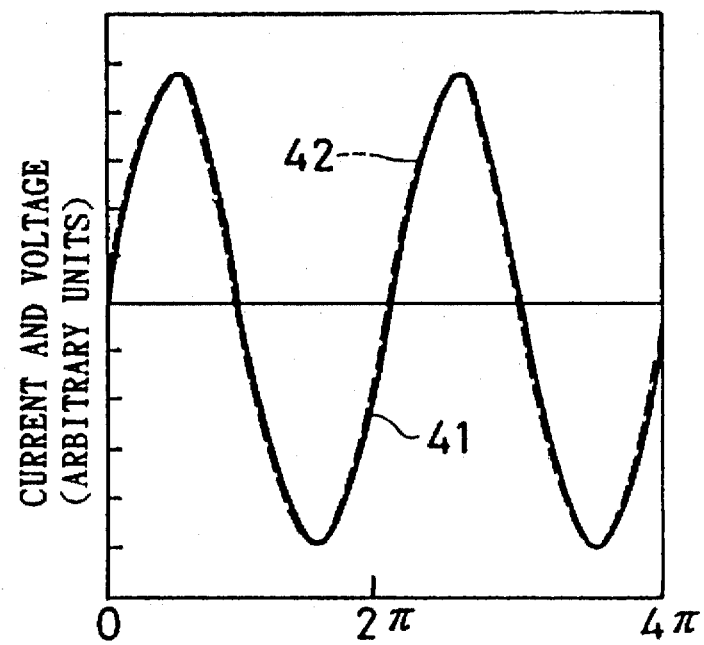
Figure 6B:
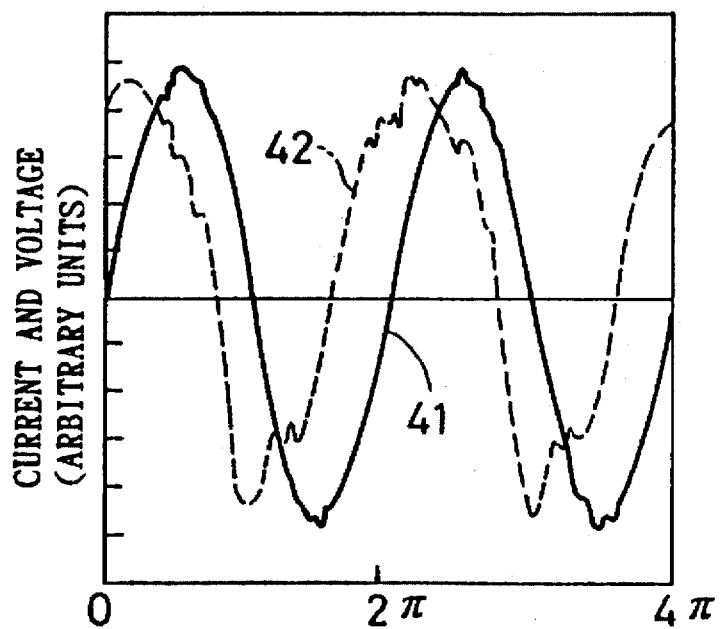
FIG. 6(B) shows voltage and current waveforms on the side of ground.
Figure 7A:
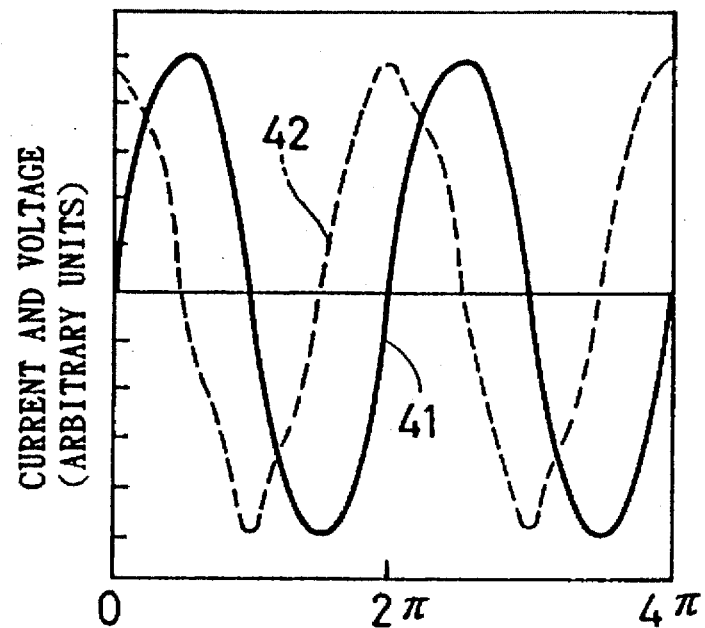
Figure 7B:
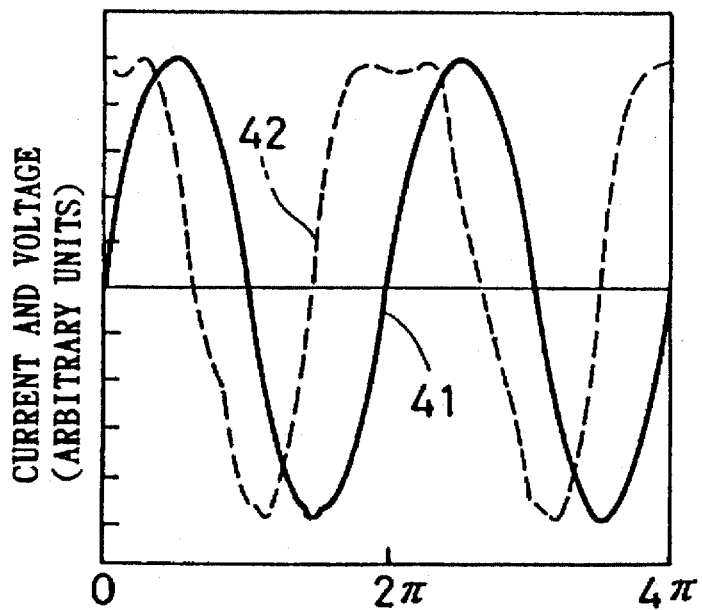
FIG. 7(B) shows voltage and current waveforms on the side of ground.
Figure 8:
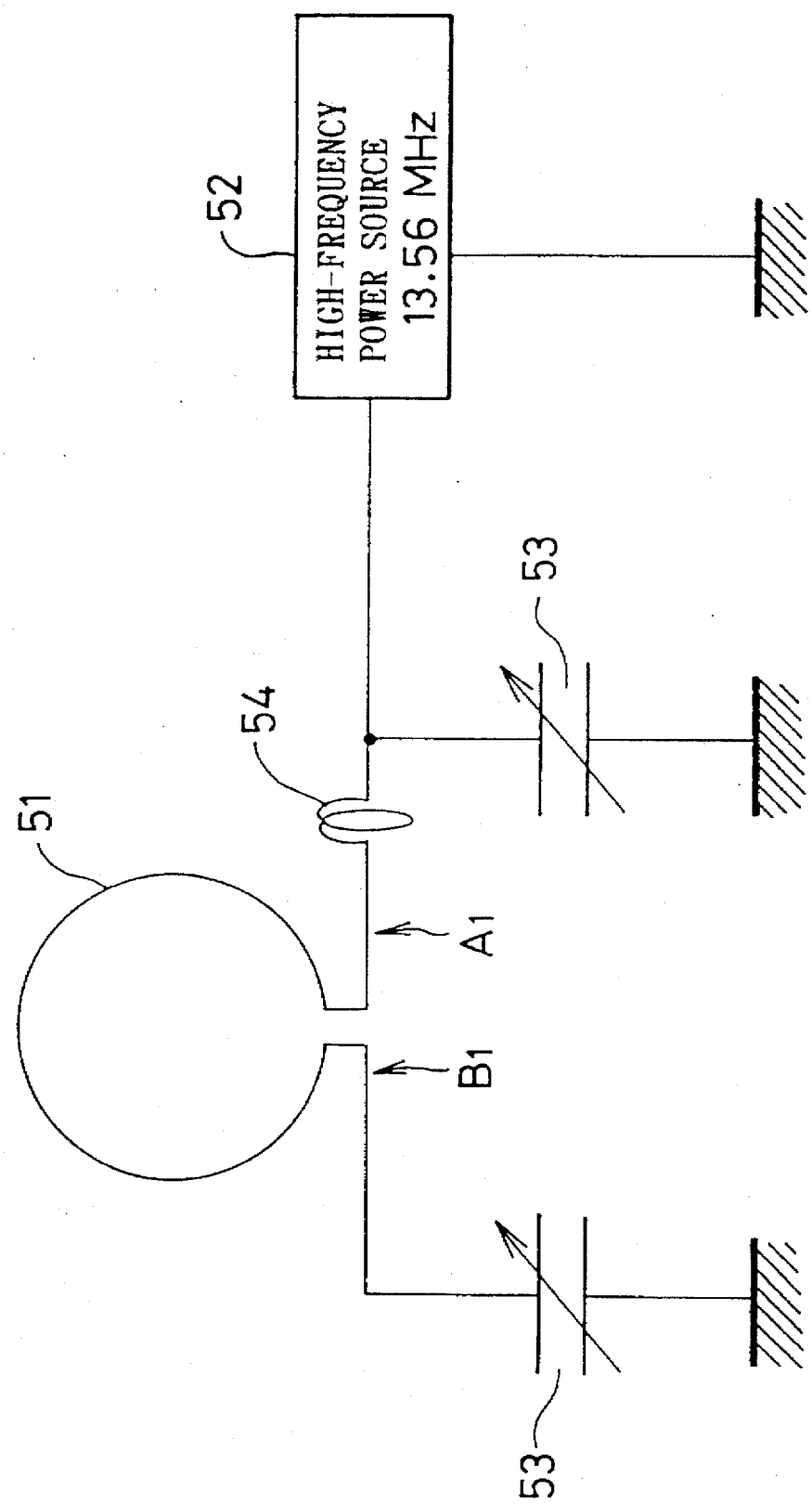
FIG. 8 is a circuit diagram of a matching circuit used for the apparatus in FIG. 1.

Next, characteristics of the single loop antenna 21 of the present embodiment will be explained in comparison with the characteristics of the conventional loop antenna 111 in the experimental apparatus by referring to FIGS. 5–7. A voltage waveform 41 (indicated by a solid line) and a current waveform 42 (indicated by a dotted line) which resulted from the measurement between the ends of the loop antenna when generating an oxygen plasma by using high-frequency electric power of 1000 W are shown in FIGS. 5, 6 and 7. FIG. 5 shows the waveforms 41 and 42 when a width (corresponding to the antenna width (b) shown in FIG. 3; hereinafter "the antenna width") of the surface in the loop antenna facing the discharge chamber 12 is 2 mm, FIG. 6 shows them when the antenna width is 15 mm, and FIG. 7 shows them when the antenna width is 150 mm. The loop antenna having the antenna width of 2 mm is equivalent to the single loop antenna 21, while the loop antenna having the antenna width of 15 mm or 150 mm is equivalent to the conventional loop antenna 111. In each of FIGS. 5–7, (A) and (B) respectively show the voltage and current characteristics of a portion A1 (in FIG. 8) on the side of a high-frequency power source and a portion B1 (also in FIG. 8) on the side of ground in the loop antenna 51 corresponding to the single loop antenna 21 or 111, as shown in a matching circuit of FIG. 8. Further, in FIG. 8, reference numeral 52 designates a high-frequency power source included in the high-frequency electric power introduction unit 13, and a variable capacitive component 53 and an inductive component 54 are electric elements forming the matching circuit. In accordance with FIGS. 5–7, it is clear that the phase difference between voltage and current at the portion B1 is in a state of phase delay when considering the corresponding phase difference at the portion A1 as a standard. Further, if the antenna width of the loop antenna is decreased, the phase delay concerning the phase difference at the portion B1 is increased. A table shown in FIG. 9 indicates a measurement result regarding the phase difference between the ends of each of the loop antennas whose antenna width is any one of 2 mm, 15 mm, or 150 mm in accordance with each high-frequency electric power level of 300 W, 500 W and 1000 W.

Figure 10:
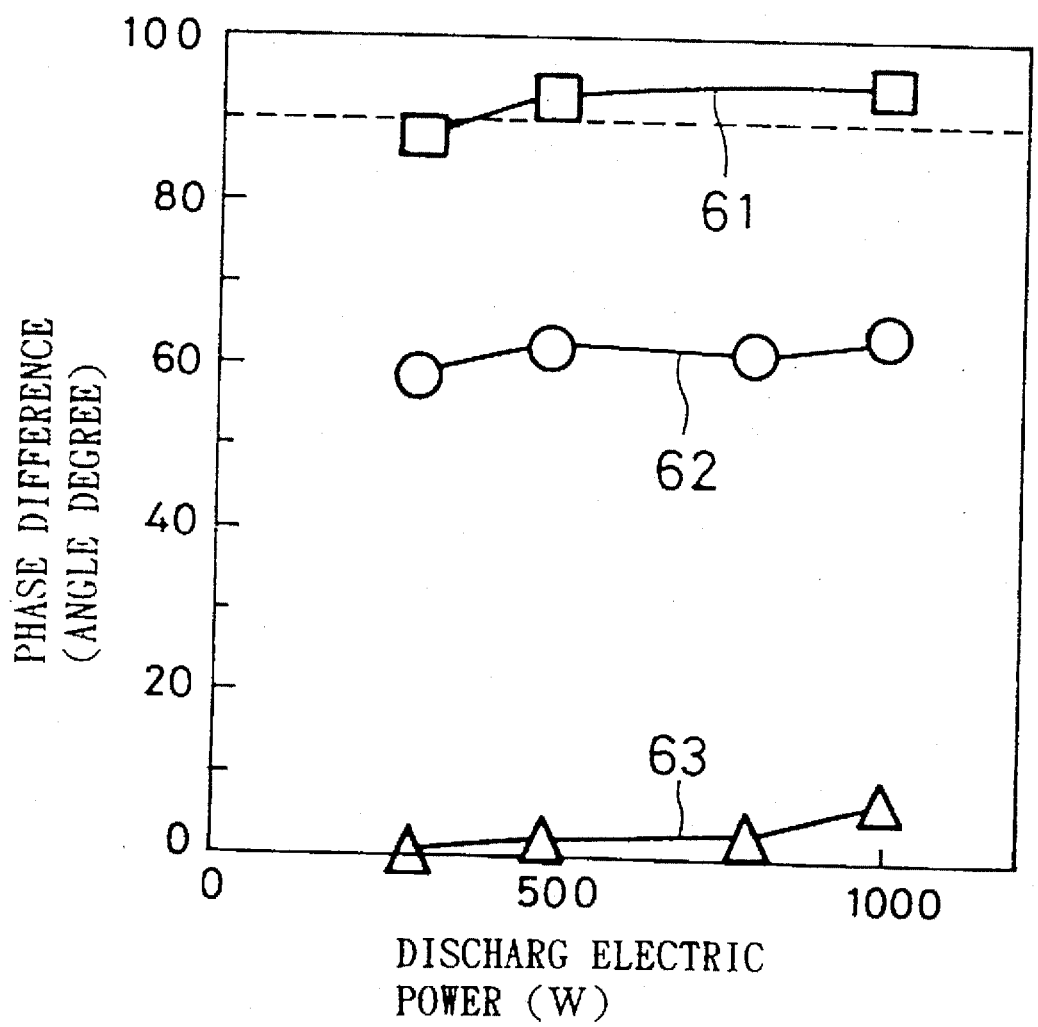
FIG. 10 shows a chart of three relational characteristics of phase difference angle versus high-frequency electric power level corresponding to each antenna width of 2, 15 and 150 mm.

Further, FIG. 10 shows dependence characteristics of the phase difference depending on the high-frequency power as to the loop antennas whose antenna width is any one of 2 mm, 15 mm and 150 mm. These dependence characteristics are obtained under such a condition that a discharge gas is oxygen $O_2$ and a discharge pressure is 1.3 Pa. In FIG. 10, a characteristic shown by reference 61 indicates the case that the antenna width of the loop antenna is 2 mm, a characteristic shown by reference 62 indicates the case that the antenna width is 15 mm, and a characteristic shown by reference 63 indicates the case that the antenna width is 150 mm. When the antenna width is 2 mm, that is, when the loop antenna is equivalent to the antenna 21 of the present embodiment, as shown in the characteristic shown by reference 61, the phase difference is substantially kept to about 90 degrees independent of the high-frequency electric power. In this case, therefore, the antenna portion including the plasma is considered to form only an almost perfect inductive component in view of the above-mentioned formula. Further, in the case that the antenna width is 2 mm, it is considered that the characteristic shown by reference 61 includes values of more than 90 degrees, because the current waveform has much noise due to high-harmonic wave components and a calculation error is generated when calculating the phase difference.

When a discharge experiment based on $C_4F_8$ gas used for an $SiO_2$ etching process in the conventional plasma processing apparatus was conducted, an undesirable sputtering action occurred in the antenna projecting part of the discharge chamber made out of quartz. In the case that the antenna width is 150 mm, the antenna projecting part of the discharge chamber is sputtered at a rate of some hundreds of μm per hour. In the case that the antenna width is 15 mm, the sputtering occurrence is also confirmed in the antenna projecting part of the discharge chamber, the sputtering rate of which is less than the rate in the case of the antenna width of 150 mm. On the other hand, in the case of the plasma processing apparatus provided with the single loop antenna 21 of the present embodiment wherein the antenna width is 2 mm, the undesirable sputtering action is not observed at all in the antenna projecting part. That is, in the plasma processing apparatus having the single loop antenna 21 according to the present embodiment, the undesirable sputtering action in the antenna projecting part of the discharge chamber can be reduced to a minimum. It becomes clear that a capacitance between the loop antenna arranged around the discharge chamber and the plasma generated in the discharge chamber definitely has a specific relation with the undesirable sputtering action in the discharge chamber, on the basis of both the above-mentioned experimental result and the measurement result regarding the phase difference between both ends of the loop antenna when generating the above-mentioned oxygen plasma. Further, if it is desired to generate plasma by an effective inductance with the least sputtering action on the discharge chamber, which is one where the phase difference in the antenna portion including plasma is 70 degrees or more, and when roughly calculating a desirable ratio of the long side to the short side in the rectangular cross section of the loop antenna based on the aforementioned result, the ratio should be three or more.

Figure 11:
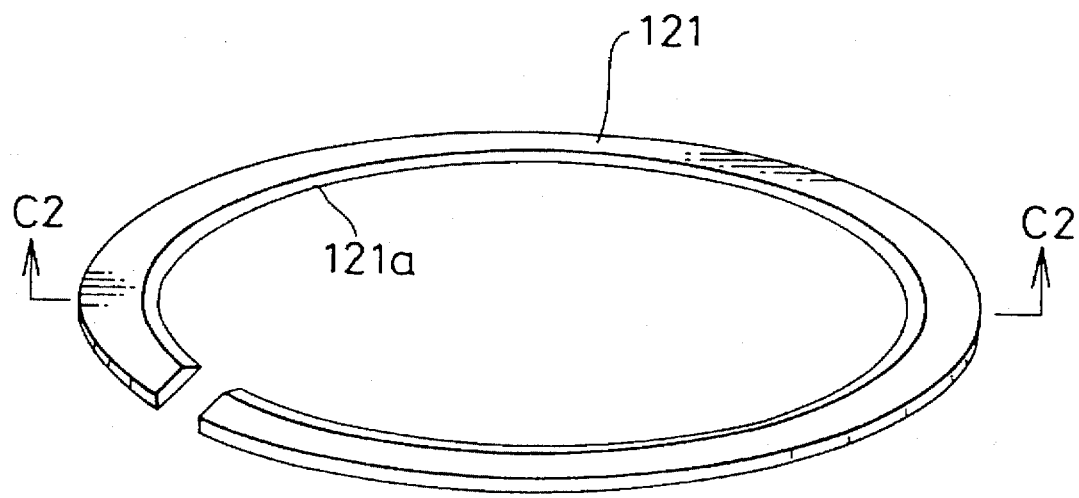
FIG. 11 is a perspective view of a second embodiment of the loop antenna.
Figure 12:
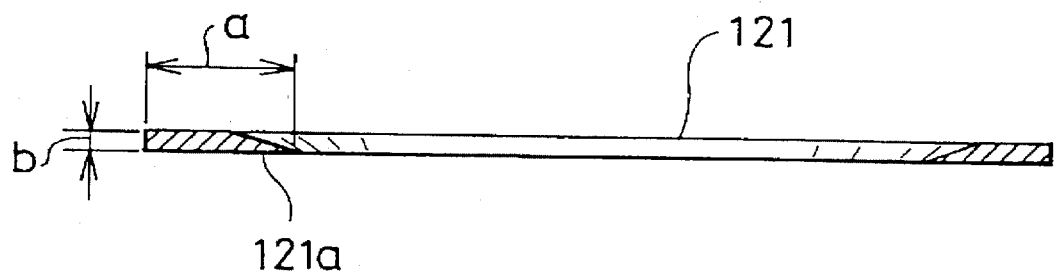
FIG. 12 is a view in section along the line C2—C2 of FIG. 11.

FIGS. 11 and 12 illustrate a second embodiment of the flat single loop antenna of the present invention. FIG. 11 is a perspective appearance view of the single loop antenna and FIG. 12 is a sectional view taken substantially along the line C2—C2 of FIG. 11. In the cross section of a single loop antenna 121, the thickness (a) is 15 mm and the antenna width (b) is 2 mm. An inside edge 121a of the loop antenna 121, which is located on the side of the discharge chamber 12, is formed to have an edge shape like a knife so that the cross section of the inside edge is an acute angle. The shape of the inside edge 121a of the loop antenna 121 can cause the surface area of the loop antenna 121 facing the discharge chamber 12 to be minimized, and thereby the capacitance between the single loop antenna and the plasma can be decreased. The area of the surface of the discharge chamber 12 corresponds with the area of the antenna portion projecting onto the discharge chamber 12. The substantial antenna width of the loop antenna 121 according to the second embodiment is shorter than the antenna width of the single loop antenna 21, and therefore the single loop antenna 121 can reduce the undesirable sputtering action even more than the single loop antenna 21.

Figure 13:
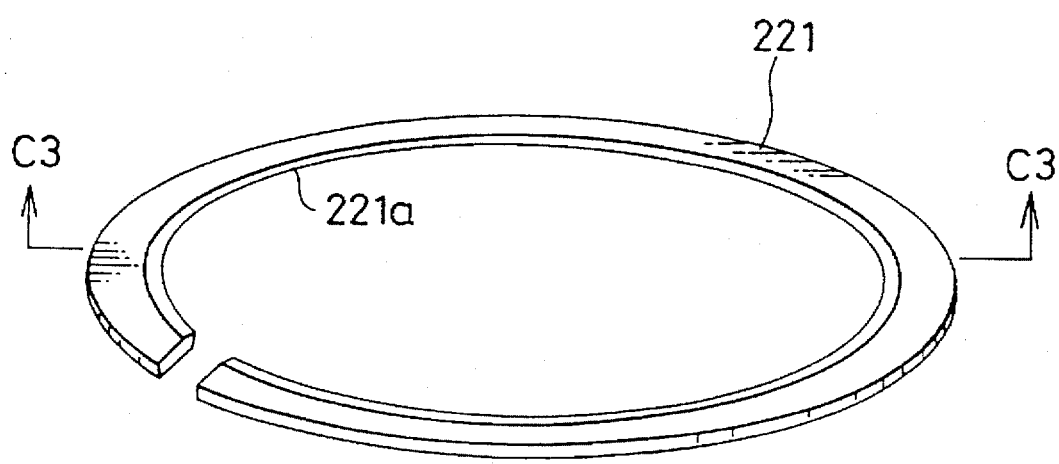
FIG. 13 is a perspective view of a third embodiment of the loop antenna.
Figure 14:
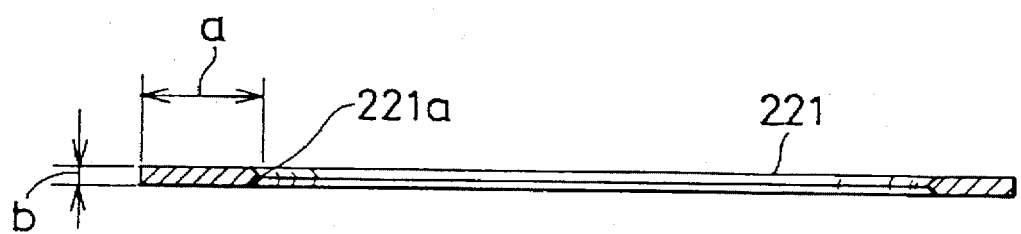
FIG. 14 is a view in section along the line C3—C3 of FIG. 13.

FIGS. 13 and 14 illustrate a third embodiment of the flat single loop antenna of the present invention. FIG. 13 is a perspective appearance view of the single loop antenna and FIG. 14 is a sectional view taken substantially along the line C3—C3 of FIG. 13. In the cross section of a single loop antenna 221, the thickness (a) is 15 mm and the antenna width (b) is 2 mm. An inside edge 221a of the single loop antenna 221, which is located on the side of the discharge chamber 12, is formed to have an acute angle like another knife. In accordance with the single loop antenna 221, the area of its surface facing the discharge chamber 12 can be minimized, and therefore the capacitance between the loop antenna and the plasma can be decreased. The substantial antenna width of the single loop antenna 221 according to the third embodiment is shorter than the antenna width of the single loop antenna 21, and therefore the loop antenna 221 can reduce the undesirable sputtering action even more than the single loop antenna 21.

Figure 15:
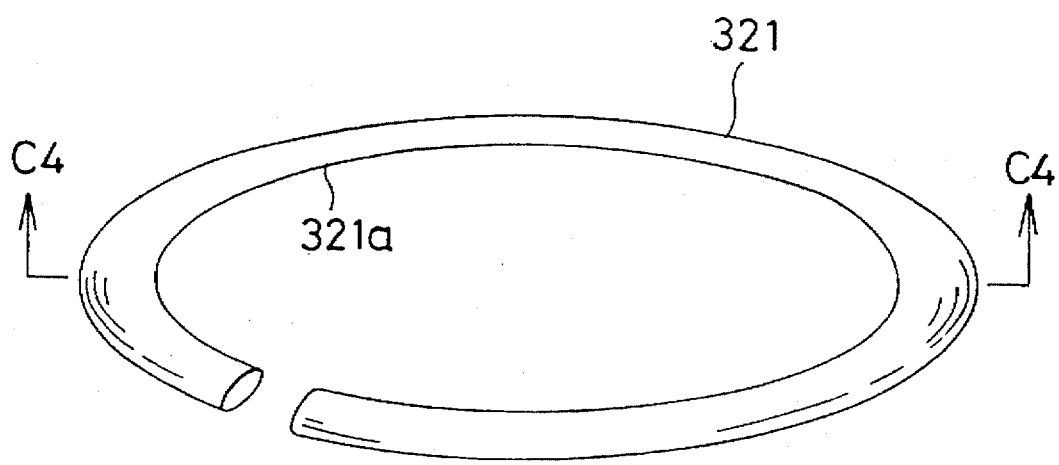
FIG. 15 is a perspective view of a fourth embodiment of the loop antenna.
Figure 16:
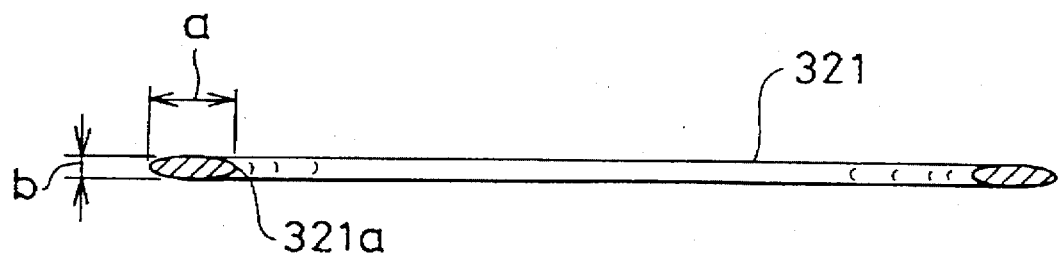
FIG. 16 is a view in section along the line C4—C4 of FIG. 15.

FIGS. 15 and 16 illustrate a fourth embodiment of the single loop antenna of the present invention. FIG. 15 is a perspective appearance view of the single loop antenna and FIG. 16 is a sectional view taken substantially along the line C4—C4 of FIG. 15. A shape of the cross section of a single loop antenna 321, is an oval, and in the cross section the thickness (a) is 15 mm and the antenna width (b) is 2 mm. An inside edge 321a of the single loop antenna 321, which is located on the side of the discharge chamber, is formed to be curved in a convex shape having an obtuse angle. In accordance with the single loop antenna 321, the area of its surface facing the outside of the discharge chamber can be extremely reduced, and therefore the capacitance between the single loop antenna and the plasma can be again decreased. The substantial antenna width of the single loop antenna 321 according to the fourth embodiment is shorter than the antenna width of the single loop antenna 21, and therefore the single loop antenna 321 can reduce the undesirable sputtering action even more than the single loop antenna 21.

Figure 17:
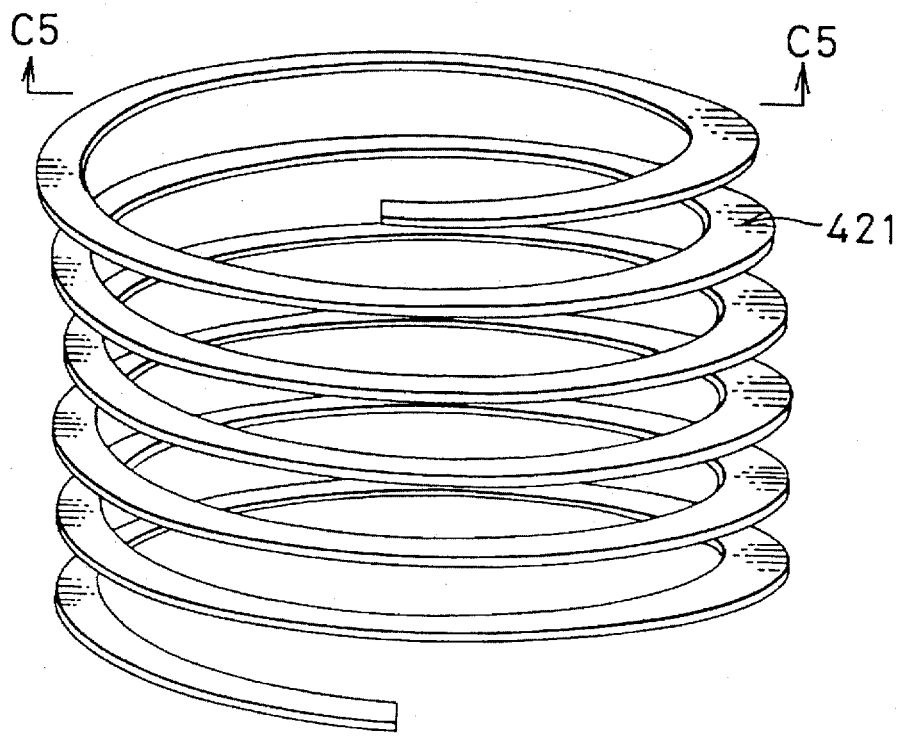
FIG. 17 is a perspective view of a fifth embodiment of the antenna according to the present invention, which is formed to be so as to include loop antenna elements.
Figure 18:
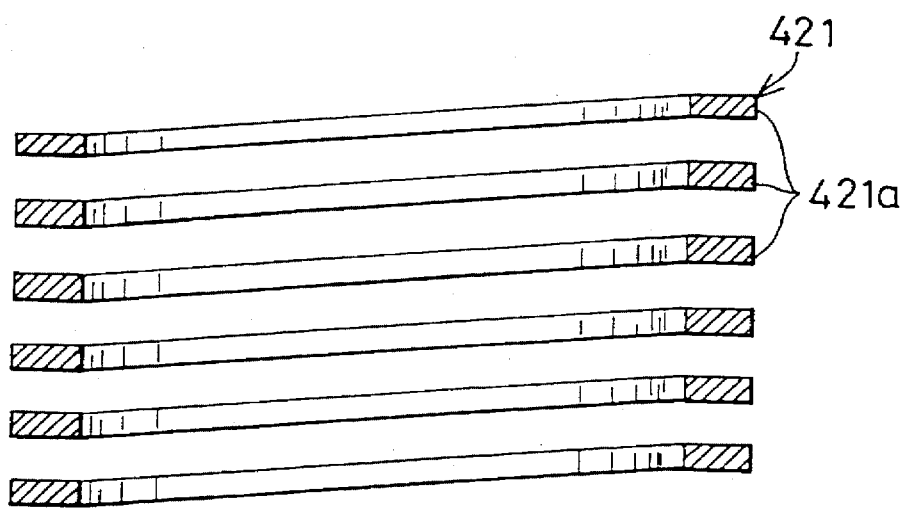
FIG. 18 is a view substantially in section along the line C5—C5 of FIG. 17.

FIGS. 17 and 18 illustrate a fifth embodiment of the loop antenna of the present invention. FIG. 17 is a perspective appearance view of the loop antenna and FIG. 18 is a sectional view taken substantially along the line C5—C5 of FIG. 17. The whole shape of this loop antenna is spiral and this loop antenna is therefore called a spiral antenna 421. Sizes of the cross section of a loop antenna 421a corresponding to one loop of the spiral antenna 421 are substantially identical to the sizes in the single loop antenna 21 illustrated in FIG. 3. The area of each of the loop antennas 421a forming the spiral antenna 421 which projects onto the discharge chamber 12, can be reduced and thereby the capacitance between the spiral antenna 421 and the plasma can be decreased. The spiral antenna 421 of the present embodiment can reduce the undesirable sputtering action in the discharge chamber 12 due to the antenna projecting area in comparison with a like conventional spiral antenna.

Figure 19:
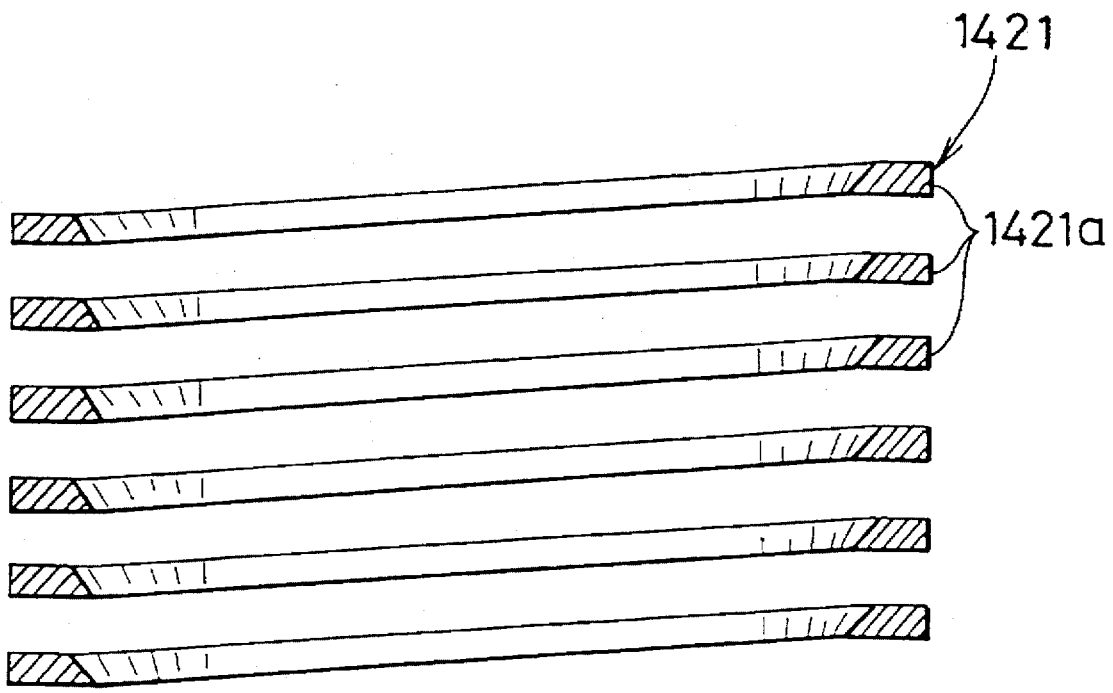
FIG. 19 is a perspective view of a modification of the of the antenna embodiment shown in FIGS. 17 and 18.

FIG. 19 shows a spiral antenna as a modification of the fifth embodiment. Sizes in the cross section of a loop antenna 1421a corresponding to one loop of the spiral antenna 1421 are substantially identical to the sizes in the loop antenna 121 illustrated in FIGS. 11 and 12. The inside edge area each of the loop antennas 1421a forming the spiral antenna 1421, which faces the outside of the side wall of the discharge chamber 12, can be extremely reduced and thereby the whole area of all of the loop antenna 1421a can be decreased. Consequently, regarding the spiral antenna, in accordance with the spiral antenna 1421 its side edge area facing the discharge chamber 12 can be reduced in comparison with the conventional spiral antenna, and thereby the capacitance between the spiral antenna and the plasma can be decreased. The spiral antenna 1421 of the present embodiment also can reduce the undesirable sputtering action in the discharge chamber 12.

Further, the inside edge of the spiral antenna 421 according to the fifth embodiment can be formed to have the knife shape or the oval shape in its cross section as explained in the third or fourth embodiment. In accordance with these configurations, the area of the antenna's surface facing the discharge chamber can also substantially be minimized in order to reduce the undesirable sputtering action in the discharge chamber.

Figure 20:
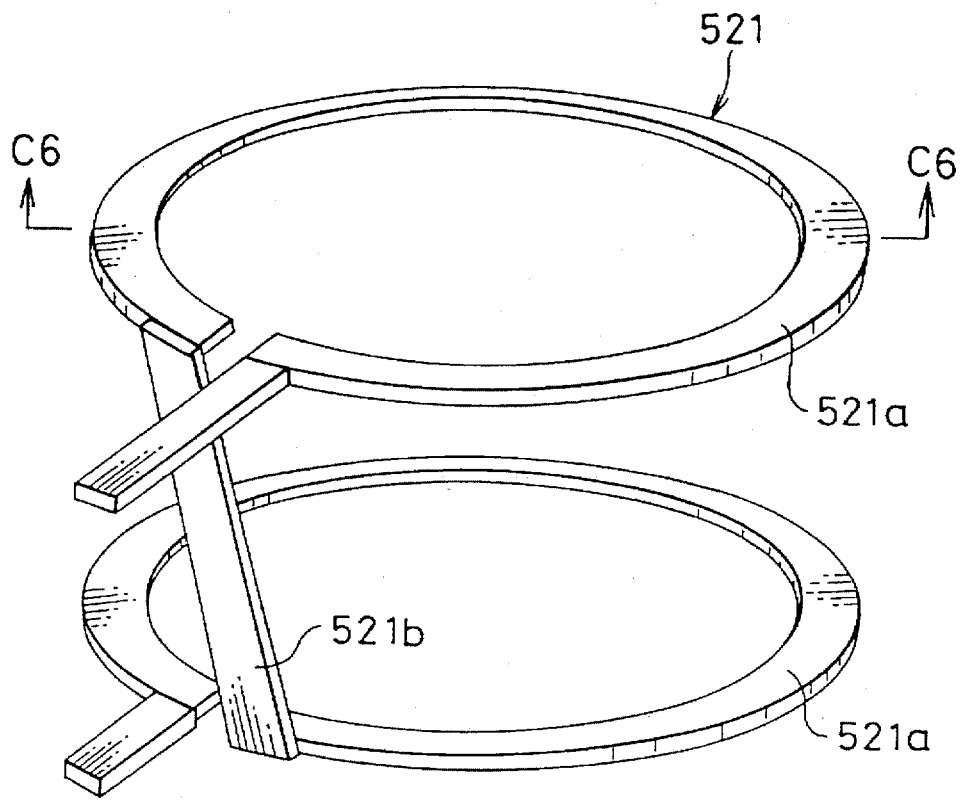
FIG. 20 is a perspective view of a sixth embodiment of the antenna according to the present invention, which is formed to include two loop antennas.
Figure 21:
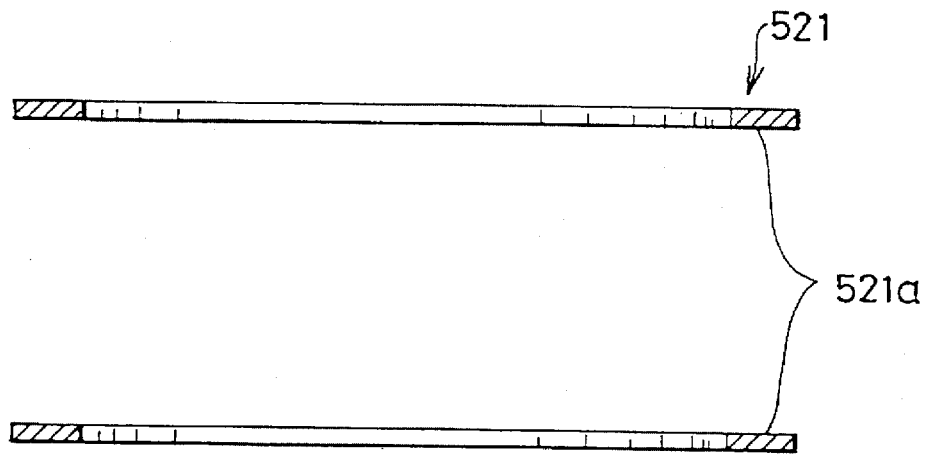
FIG. 21 is a view in section along the line C6—C6 of FIG. 20.

FIGS. 20 and 21 illustrate sixth embodiment of the loop antenna of the present invention. FIG. 20 is a perspective appearance view of the loop antenna and FIG. 21 is a sectional view taken substantially along the line C6—C6 of FIG. 20. This antenna 521 is used as a helicon wave excitation antenna. The antenna 521 includes two loop antennas 521a having a cross section identical to the cross section of the loop antenna of the first embodiment, which are connected by a connecting member 521b. The helicon wave excitation antenna 521 having such a configuration explained in this embodiment, which supplies the discharge chamber with a stationary magnetic field, can reduce the undesirable sputtering action in the discharge chamber in comparison with the conventional helicon wave excitation antenna. The inside edge of the antenna 521, which is located on the side of the discharge chamber, can be formed so as to have the knife shape or the oval shape in its cross section as explained in the second, third and fourth embodiments. In accordance with these configurations the antenna's surface area facing the discharge chamber can also substantially be minimized in order to reduce the undesirable sputtering action in the discharge chamber.

The above-mentioned embodiments show that any one of the one loop antennas, or the plural loops antenna such as the spiral antenna or the like, can be used for an inductive coupling plasma processing apparatus having a cylindrical discharge chamber with the inside diameter of 266 mm. However, further, the loop antenna of the present invention can be used for any shape of diameter of discharge chamber. Further, it is a matter of course that the side walls of discharge chambers having any arbitrary shape will be sputtered over a minimum area by the strong inductive coupling, which is dependent on the antenna diameter and the number of turns therein, of the apparatus of the present invention. By controlling the antenna width (b) of the antenna applied to any arbitrarily-shaped discharge chamber, to achieve a phase difference of 70 degrees or more, the plasma discharge will occur based on a strong inductive coupling, and the undesirable capacitive coupling will be reduced as much as possible.

Figure 22:
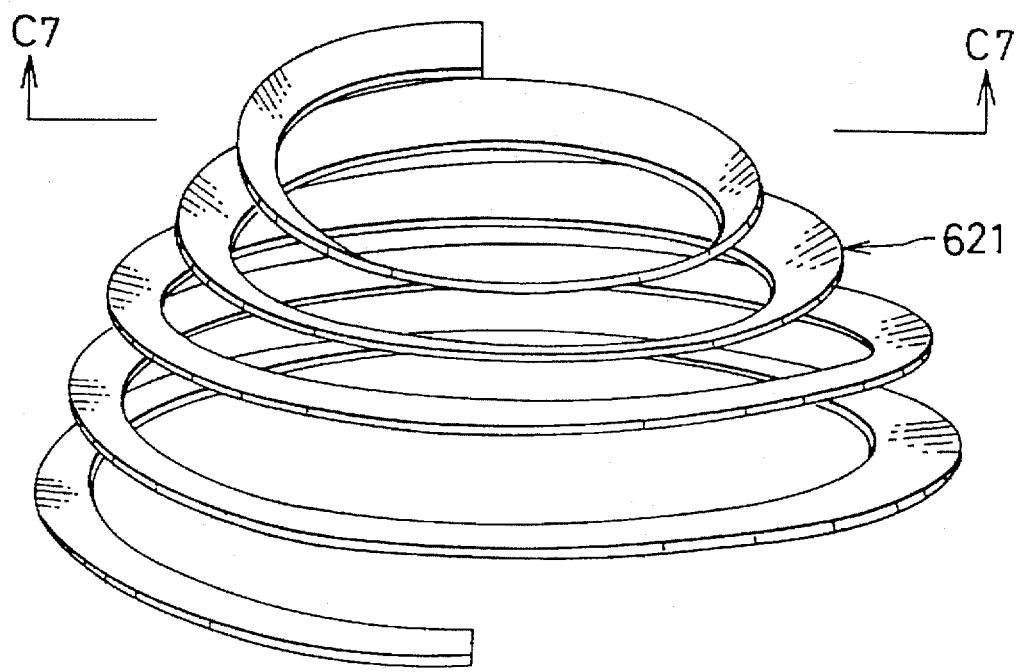
FIG. 22 is a perspective view of a seventh embodiment of the antenna according to the present invention, which is applied to the inductive coupling plasma processing apparatus equipped with a hemispheric discharge chamber.
Figure 23:
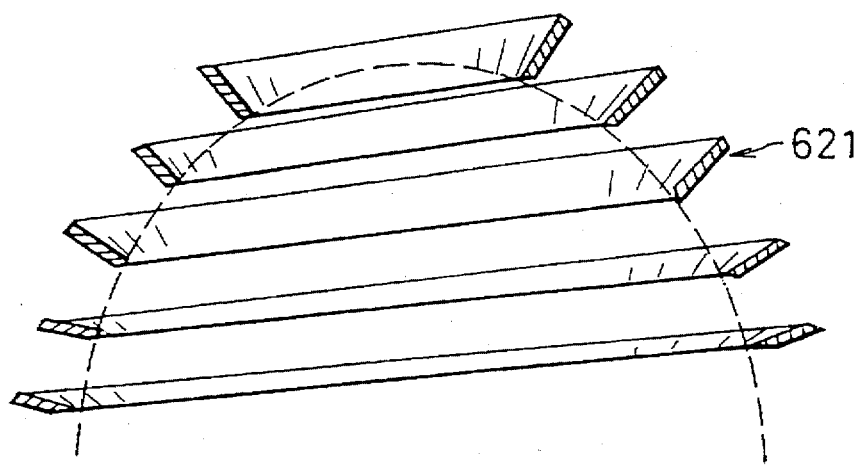
FIG. 23 is a view in section along the line C7—C7 of FIG. 22.

FIGS. 22 and 23 illustrate a seventh embodiment of the loop antenna of the present invention. FIG. 22 is a perspective appearance view of the antenna and FIG. 23 is a sectional view taken substantially along the line C7—C7 of FIG. 22. This loop antenna includes a spiral antenna 621 applied to the inductive coupling plasma processing apparatus with a hemispheric discharge chamber. The shape of the cross section of the spiral antenna 621 is substantially identical to the shape of the cross section of the single loop antenna 21 of the first embodiment. In this embodiment, since the spiral antenna 621 is arranged around the hemispheric discharge chamber so that its inside edge is located along the outside surface of the chamber, the inside edge of the spiral antenna 621 makes an acute angle with the outside surface of the hemispheric discharge chamber. Therefore, the area of the inside edge facing the outside surface of the chamber can be minimized. The spiral antenna with such a configuration shown in the embodiment can reduce the undesirable sputtering action in the discharge chamber in comparison with the conventional ordinary spiral antenna. The inside edge of the spiral antenna 621, which is located on the side of the discharge chamber, can be positively formed so as to have the knife shape or the oval shape in its cross section as explained in the second, third and fourth embodiments. In accordance with these embodiments, the area of the antenna's surface facing the hemispheric discharge chamber can substantially be minimized and the antenna width can be decreased in comparison with the antenna 621 of the seventh embodiment to reduce the undesirable sputtering action in the discharge chamber.

Figure 24:
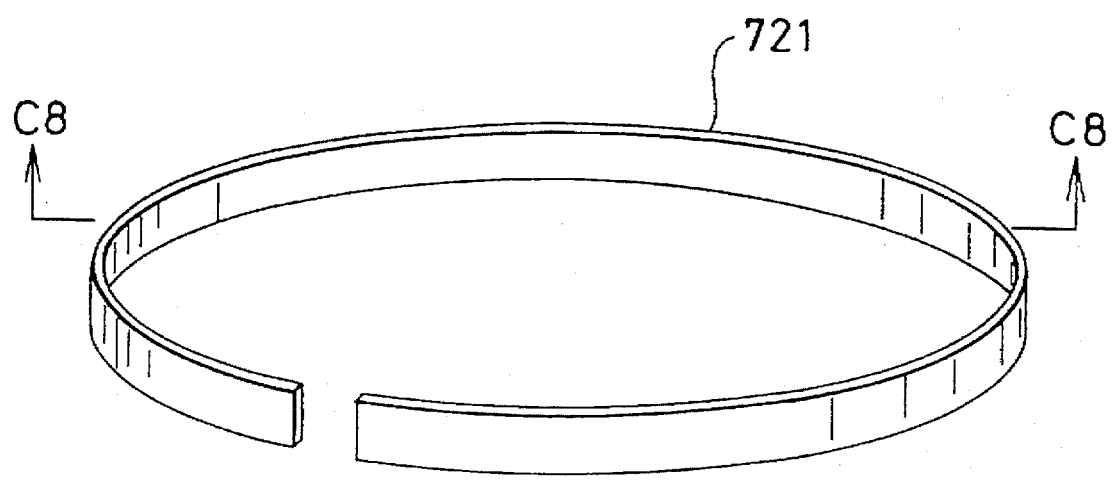
FIG. 24 is a perspective view of an eighth embodiment of the antenna according to the present invention, which is applied to the inductive coupling plasma processing apparatus with a flat dielectric portion.
Figure 25:
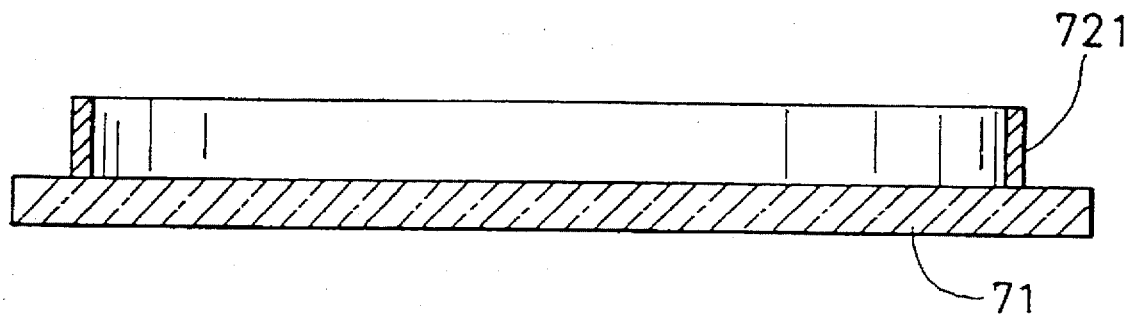
FIG. 25 is a view in section along the line C8—C8 of FIG. 24.

FIGS. 24 and 25 illustrate an eighth embodiment of the loop antenna of the present invention. FIG. 24 is a perspective appearance view of the antenna and FIG. 23 is a sectional view taken substantially along the line C8—C8 of FIG. 24. A loop antenna 721 of this embodiment indicates an antenna applied to the inductive coupling plasma processing apparatus having a belt dielectric portion used for introducing the high-frequency electric power. In FIG. 25, reference numeral 71 designates the flat dielectric portion used for introducing the high-frequency electric power. A shape of the cross section of the loop antenna 721 is substantially identical to the corresponding shape of the single loop antenna 21 of the first embodiment as to the positional relationship between the loop antenna 721 and the surface of the dielectric portion 71. The loop antenna 721 of the present embodiment can reduce the undesirable sputtering action in comparison with the similar conventional ordinary loop antenna. The edge of the loop antenna 721, which is located on the side of the dielectric portion 71, can be also formed to have the knife shape or the oval shape in its cross section as explained in the second, third and fourth embodiments. In accordance with these configurations, the area of the antenna's surface projecting onto the dielectric portion 71 of the discharge chamber can be substantially minimized and the antenna width can be decreased in comparison with the antenna 721 of the eighth embodiment to reduce the undesirable sputtering action in the discharge chamber.

Figure 26:
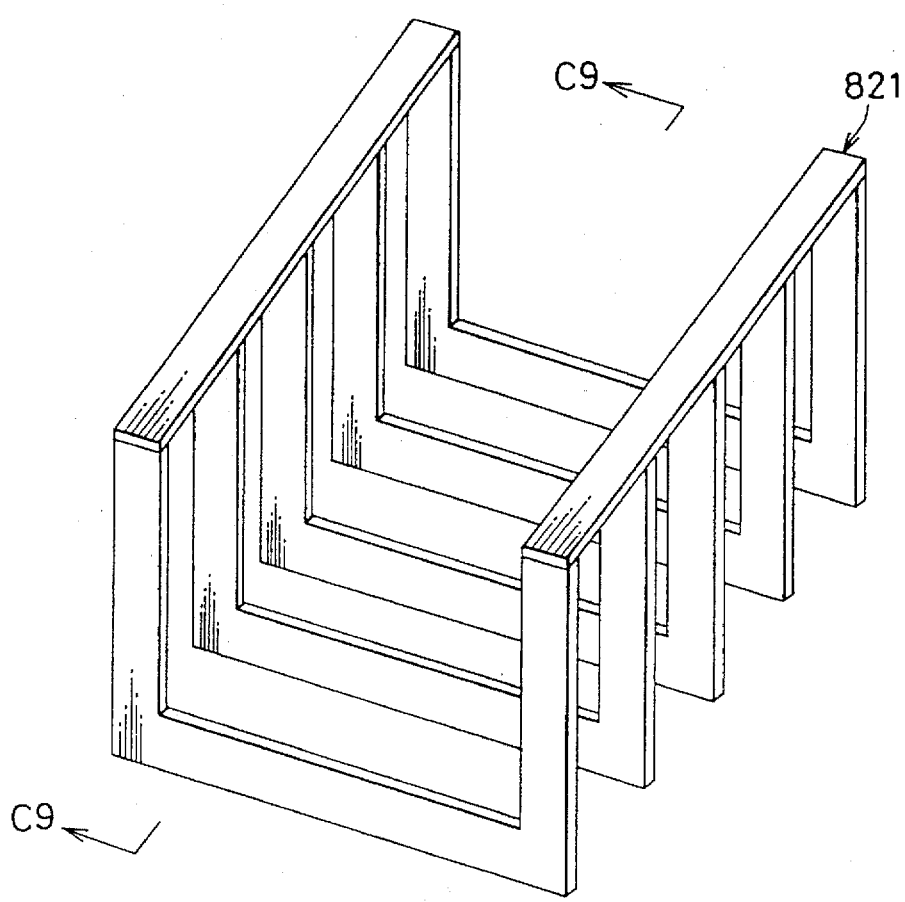
FIG. 26 is a perspective view of a ninth embodiment of the antenna according to the present invention, which is applied to the inductive coupling plasma processing apparatus with a flat dielectric portion.
Figure 27:
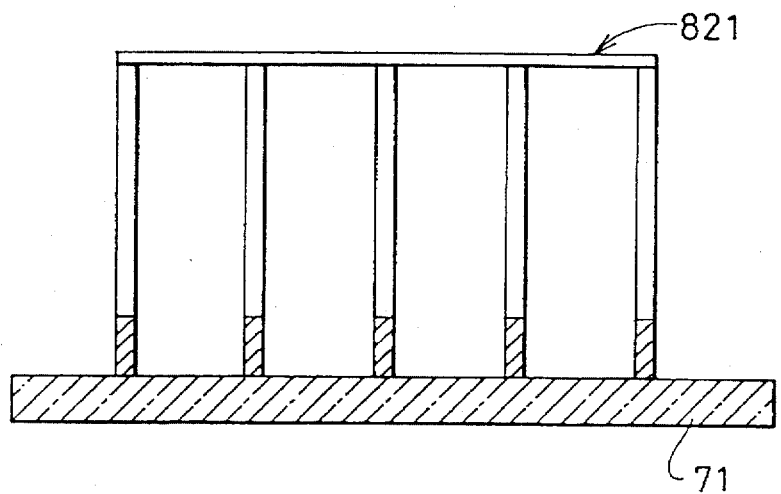
FIG. 27 is a view in section along the line C9—C9 of FIG. 26.

FIGS. 26 and 27 illustrate a ninth embodiment of the antenna of the present invention. FIG. 26 is a perspective appearance view of the antenna and FIG. 27 is a sectional view taken substantially along the line C9—C9 of FIG. 26. The antenna 821 of this embodiment indicates a rib antenna also applied to the inductive coupling plasma processing apparatus with the flat dielectric portion used for introducing the high-frequency electric power. In FIG. 27, the reference numeral 71 designates the flat dielectric portion used for introducing the high-frequency electric power. The shape of the cross section of each of the flat rib-plates in the parallel rib-plate antenna 821, which are perpendicularly contacted with the surface of the flat dielectric portion, is substantially identical to the corresponding shape of the single loop antenna 21 of the first embodiment. The rib antenna 821 of the present embodiment can reduce the undesirable sputtering action in comparison with the like conventional ordinary read screen antenna. The edges of the rib-plates of the rib antenna 821, which are located on the side of the dielectric portion 71, can be also formed to have the knife shape or the oval shape in its cross section as explained in the second, third and fourth embodiments. In accordance with these configurations, the area of the antenna's surfaces facing the dielectric portion 71 of the discharge chamber can be substantially minimized, and therefore the undesirable sputtering action in the discharge chamber can be reduced.

In each of the aforementioned embodiments, a cooler which is actually necessary for a practical apparatus was, for convenience, not explained. However, when conducting a continuous discharge by using any one of the above mentioned loop antennas, the loop antenna is heated due to joule heat because of the large high-frequency current flowing therein, and consequently the continuous discharge becomes unstable owing to a change in matching conditions in accordance with a change in impedance of the antenna. Then, the embodiments of the loop antenna provided with a cooler for decreasing heat generated therein will be explained hereinafter.

Figure 28:
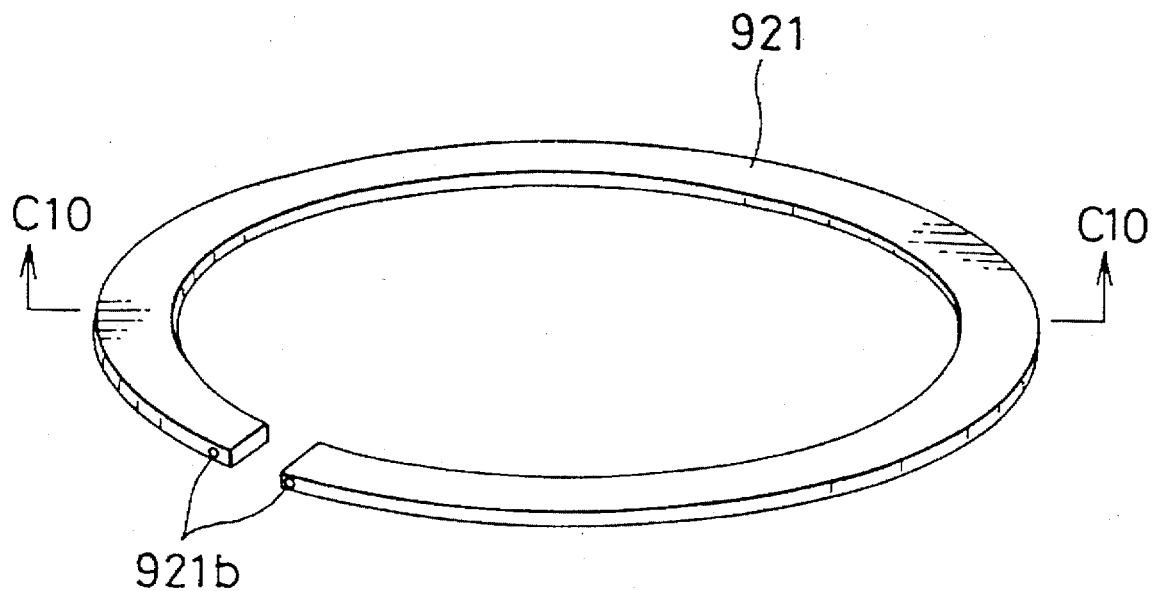
FIG. 28 is a perspective view of a tenth embodiment of the loop antenna according to the present invention.
Figure 29:
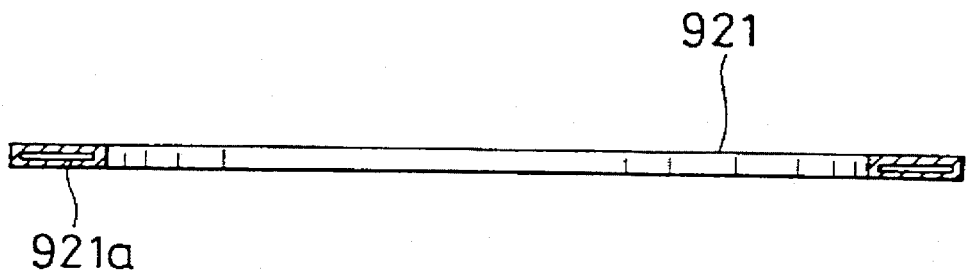
FIG. 29 is a view in section along the line C10—C10 of FIG. 28.

FIGS. 28 and 29 illustrate a tenth embodiment of the loop antenna of the present invention. FIG. 28 is a perspective appearance view of the loop antenna and FIG. 29 is a sectional view taken substantially along the line C10—C10 of FIG. 28. The loop antenna 921 includes a cooling passage for cooling the loop antenna without spoiling the less sputtering action explained in the first embodiment. The single loop antenna 921 of this embodiment is the same as the single loop antenna 21 of the first embodiment in the aspects of the appearance (shape) and the cross sectional shape, and is formed as a curved pipe shape, and further has an internal passage 912a used as a cooling water flowing passage. In FIG. 28, 921b designates an inlet or an outlet of the internal passage 921a. The internal passage 921a where the cooling water flows decreases heat generated in the loop antenna due to joule effect without losing the reducing effect as to the above-mentioned sputtering action, and therefore can keep the plasma discharge state stable. The cooling structure of the present embodiment can apply to all of the aforementioned embodiments.

Figure 30:
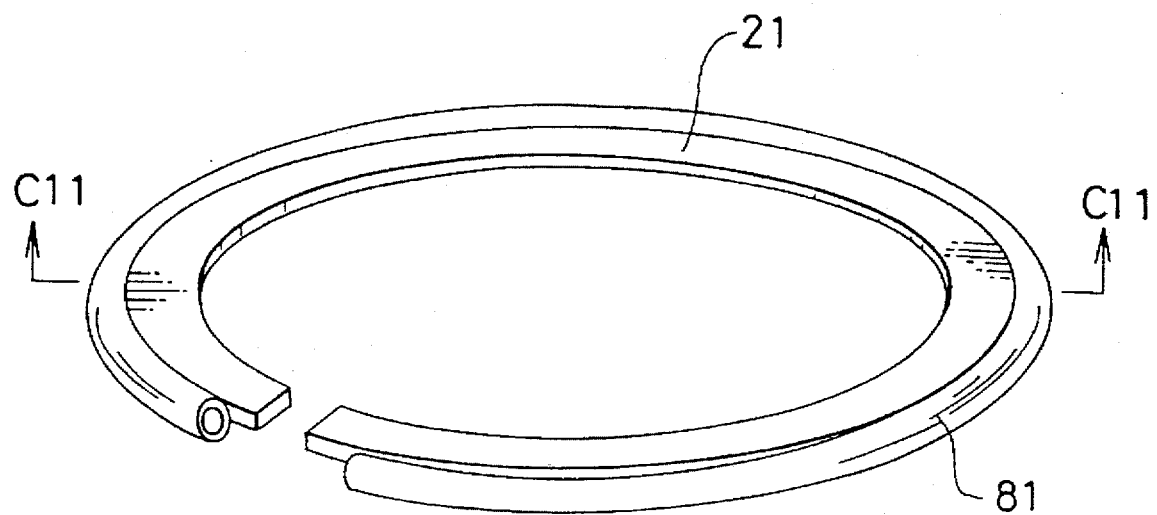
FIG. 30 is a perspective view of a eleventh embodiment of the loop antenna.
Figure 31:
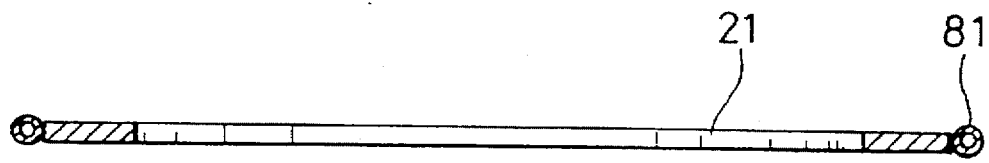
FIG. 31 is a view in section along the line C11—C11 of FIG. 30.

FIGS. 30 and 31 illustrates an eleventh embodiment of the loop antenna of the present invention. FIG. 30 is a perspective appearance view and FIG. 31 is a sectional view taken substantially along the line C11—C11 of FIG. 30. This embodiment indicates a structure wherein the single loop antenna 21 of the first embodiment is surrounded by a curved tube 81 including a cooling water passage. The structure according to this embodiment can take away heat generated in the single loop antenna 21 due to joule effect and keep the discharge state stable, because the cooling water flowing in the tube 81 can cool the loop antenna 21 without spoiling the reducing effect as to the undesirable sputtering action. The cooling structure of the present embodiment can also apply to all of the aforementioned embodiments.

Further, every apparatus explained in the respective embodiments can be equipped with a well-known magnetic field generating unit on the outside of the vacuum chamber 14 in order to supply the internal space of the vacuum chamber 14 or the discharge chamber 12 with a magnetic field.

In accordance with the present invention, as explained in the respective embodiments, since the antenna arranged around or near the discharge chamber made out of a dielectric material such as quartz or the like is so formed that the area of the antenna's part projecting onto the outside surface of the side wall of the discharge chamber (or the antenna's nearest surface facing the outside surface) is reduced as much as possible, the undesirable sputtering action generated in the antenna projecting portion of the discharge chamber can be reduced as much as possible, and further contamination on the substrate to be processed during a process can be reduced to a minimum. Consequently, destruction on the discharge chamber can be reduced and the durability and safety as to the portion made out of the dielectric material can be improved.

What is claimed is:

1. A plasma processing apparatus comprising:

a vacuum chamber having a dielectric portion into which high-frequency electric power is introduced and in which a plasma discharge may be generated, an evacuation means for reducing a pressure in an inside space of the vacuum chamber, a gas introduction means for introducing a reactive gas into said vacuum chamber, an antenna arranged around said dielectric portion and formed so that a shape of a cross section thereof perpendicular to a flow direction of a high-frequency current is flat and a long side of the cross section is substantially perpendicular to an outside surface of said dielectric portion, a high-frequency electric power introduction means for supplying said antenna with the high-frequency electric power and introducing the high-frequency electric power into said vacuum chamber through said dielectric portion in accordance with an inductive coupling action, and a substrate holding means arranged in said vacuum chamber, a holding surface of which faces a surface of said dielectric portion in said vacuum chamber.

2. A plasma processing apparatus according to claim 1, wherein said dielectric portion forms a part of said vacuum chamber and said antenna is formed in a single loop shape so as to surround said dielectric portion.

3. A plasma processing apparatus according to claim 1, wherein said dielectric portion forms a part of said vacuum chamber and said antenna is formed in a plural turns spiral shape so as to surround said dielectric portion.

4. A plasma processing apparatus according to claim 1, wherein said dielectric portion forms a part of said vacuum chamber and said antenna includes at least two loop antenna elements arranged at an arbitrary interval so that said two loop antenna elements surround said dielectric portion.

5. A plasma processing apparatus according to claim 2, wherein a shape of said dielectric portion is cylindrical.

6. A plasma processing apparatus according to claim 3, wherein a shape of said dielectric portion is cylindrical.

7. A plasma processing apparatus according to claim 4, wherein a shape of said dielectric portion is cylindrical.

8. A plasma processing apparatus according to claim 3, wherein a shape of said dielectric portion is hemispheric.

9. A plasma processing apparatus according to claim 3, wherein a shape of said dielectric portion is hemispheric.

10. A plasma processing apparatus according to claim 4, wherein a shape of said dielectric portion is hemispheric.

11. A plasma processing apparatus according to claim 1, wherein said antenna has a flat-plate loop shape and is arranged so that the antenna can be substantially perpendicular to an outside surface of the dielectric portion.

12. A plasma processing apparatus according to claim 1, wherein said dielectric portion has a flat-plate shape and said antenna has a loop shape having a size in an axial direction larger than a size in a diameter direction.

13. A plasma processing apparatus according to claim 1, wherein said dielectric portion has a flat-plate shape and said antenna has a rib shape which has at least one flat-plate portion arranged perpendicular to an outside surface of said dielectric portion.

14. A plasma processing apparatus according to claim 1, wherein a length ratio between a long side and a short side of the cross section of said antenna is three or more.

15. A plasma processing apparatus according to claim 1, wherein an edge of said antenna facing an outside surface of said dielectric portion has an acute angle in a cross section thereof.

16. A plasma processing apparatus according to claim 1, wherein a shape of a cross section of said antenna is oval.

17. A plasma processing apparatus according to claim 1, further comprising a magnetic field generating means for producing a magnetic field in the inside space of said vacuum chamber where the plasma discharge may be generated.

18. A plasma processing apparatus according to claim 1, wherein said antenna includes a passage in which cooling media flows.

19. A plasma processing apparatus according to claim 1, further comprising a passage member arranged around said antenna for introducing cooling media.

20. A plasma processing apparatus comprising:

a vacuum chamber having a dielectric portion into which high-frequency electric power is introduced and in which a plasma discharge may be generated, an evacuation means for reducing a pressure in an inside space of the vacuum chamber, a gas introduction means for introducing a reactive gas into said vacuum chamber, an antenna arranged so as to surround said dielectric portion and having a surface nearest to said dielectric portion, wherein said antenna is so formed that a shape thereof is a plural turns spiral and that a shape of a cross section thereof is perpendicular to a flow direction of a high-frequency current is flat and a long side of the cross section is substantially perpendicular to an outside surface of said dielectric portion, and the area of the nearest surface is minimized, a high-frequency electric power introduction means for supplying said antenna with the high-frequency electric power and introducing the high-frequency electric power into said vacuum chamber through said dielectric portion in accordance with an inductive coupling action, and a substrate holding means arranged in said vacuum chamber, a holding surface of which faces an inside space of said dielectric portion.

21. A plasma processing apparatus according to claim 20, wherein a shape of said dielectric portion is cylindrical.

22. A plasma processing apparatus according to claim 20, wherein a shape of said dielectric portion is hemispheric.

23. A plasma processing apparatus according to claim 20, wherein an edge of said antenna facing the outside surface of said dielectric portion has an acute angle in the cross section thereof.

* * * * *